(12) United States Patent
Cordes et al.

(10) Patent No.: US 7,784,664 B2
(45) Date of Patent: *Aug. 31, 2010

(54) FILL HEAD FOR INJECTION MOLDING OF SOLDER

(75) Inventors: Steven A. Cordes, Yorktown Heights, NY (US); Peter A. Gruber, Mohegan Lake, NY (US); John U. Knickerbocker, Monroe, NY (US); James L. Speidell, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/189,822

(22) Filed: Aug. 12, 2008

(65) Prior Publication Data

US 2008/0302502 A1 Dec. 11, 2008

Related U.S. Application Data

(63) Continuation of application No. 11/409,233, filed on Apr. 21, 2006, now Pat. No. 7,410,092.

(51) Int. Cl.
*B23K 37/00* (2006.01)
*B23K 31/02* (2006.01)

(52) U.S. Cl. .................................... 228/33; 228/256

(58) Field of Classification Search .............. None
See application file for complete search history.

(56) References Cited

U.S. PATENT DOCUMENTS

| | | | |
|---|---|---|---|
| 5,244,143 A | 9/1993 | Ference et al. | |
| 5,254,362 A | 10/1993 | Shaffer et al. | |
| 5,545,465 A | 8/1996 | Gaynes et al. | |
| 5,593,080 A | 1/1997 | Teshima et al. | |
| 5,718,367 A | 2/1998 | Covell, II et al. | |

(Continued)

FOREIGN PATENT DOCUMENTS

CN 1396641 A 2/2003

OTHER PUBLICATIONS

Advanced Packaging Magazine, Nov. 2005.

(Continued)

*Primary Examiner*—Kiley Stoner
(74) *Attorney, Agent, or Firm*—Jose Gutman; Fleit Gibbons Gutman Bongini & Bianco P.L.

(57) ABSTRACT

A system, method, and apparatus for injection molding conductive bonding material into a plurality of cavities in a surface are disclosed. The method comprises aligning a fill head with a surface. The mold includes a plurality of cavities. The method further includes placing the fill head in substantial contact with the surface. At least a first gas is channeled about a first region of the fill head. The at least first gas has a temperature above a melting point of conductive bonding material residing in a reservoir thereby maintaining the conductive bonding material in a molten state. The conductive bonding material is forced out of the fill head toward the surface. The conductive bonding material is provided into at least one cavity of the plurality of cavities contemporaneous with the at least one cavity being in proximity to the fill head.

1 Claim, 27 Drawing Sheets

U.S. PATENT DOCUMENTS

| | | | |
|---|---|---|---|
| 6,231,333 B1 * | 5/2001 | Gruber et al. | 425/546 |
| 6,332,569 B1 | 12/2001 | Cordes et al. | |
| 6,390,439 B1 | 5/2002 | Cordes et al. | |
| 6,461,136 B1 * | 10/2002 | Gruber et al. | 425/110 |
| 6,527,158 B1 * | 3/2003 | Brouillette et al. | 228/33 |
| 6,641,868 B2 | 11/2003 | Abe et al. | |
| 6,725,769 B1 | 4/2004 | Williams | |
| 7,032,513 B2 | 4/2006 | Onishi et al. | |
| 7,322,511 B2 | 1/2008 | Farrar et al. | |
| 7,410,090 B2 * | 8/2008 | Cordes et al. | 228/180.1 |
| 7,410,092 B2 * | 8/2008 | Cordes et al. | 228/256 |
| 7,416,104 B2 * | 8/2008 | Cordes et al. | 228/103 |
| 2001/0035450 A1 | 11/2001 | Mannhart et al. | |
| 2002/0175438 A1 * | 11/2002 | Gruber et al. | 264/102 |
| 2003/0170935 A1 | 9/2003 | Rutiser | |
| 2004/0108368 A1 | 6/2004 | Onishi et al. | |
| 2004/0238595 A1 | 12/2004 | Nogiwa et al. | |
| 2005/0051604 A1 | 3/2005 | Claver et al. | |
| 2005/0109823 A1 * | 5/2005 | Gruber et al. | 228/246 |
| 2005/0263571 A1 * | 12/2005 | Belanger et al. | 228/256 |
| 2006/0231591 A1 * | 10/2006 | Gruber et al. | 228/101 |
| 2007/0178625 A1 * | 8/2007 | Danovitch et al. | 438/108 |
| 2007/0246511 A1 * | 10/2007 | Cordes et al. | 228/101 |
| 2007/0246516 A1 * | 10/2007 | Cordes et al. | 228/180.22 |
| 2007/0272389 A1 * | 11/2007 | Gruber et al. | 164/488 |
| 2008/0272177 A1 * | 11/2008 | Cordes et al. | 228/33 |
| 2008/0285136 A1 * | 11/2008 | Jacobowitz et al. | 359/619 |

OTHER PUBLICATIONS

Gruber, et al., "Low-cost wafer bumping," IBM J. Research and Development, vol. 49, No. 4.5, Jul./Sep. 2005, pp. 621-639.

Technology Roadshow 2005 for Advanced Packaging, MEMS and Nanotechnologies.

* cited by examiner

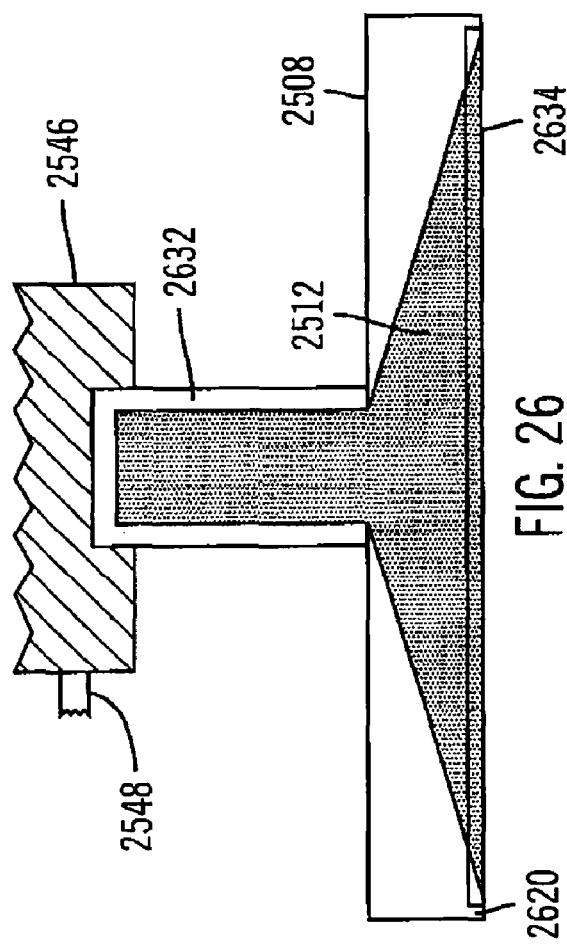
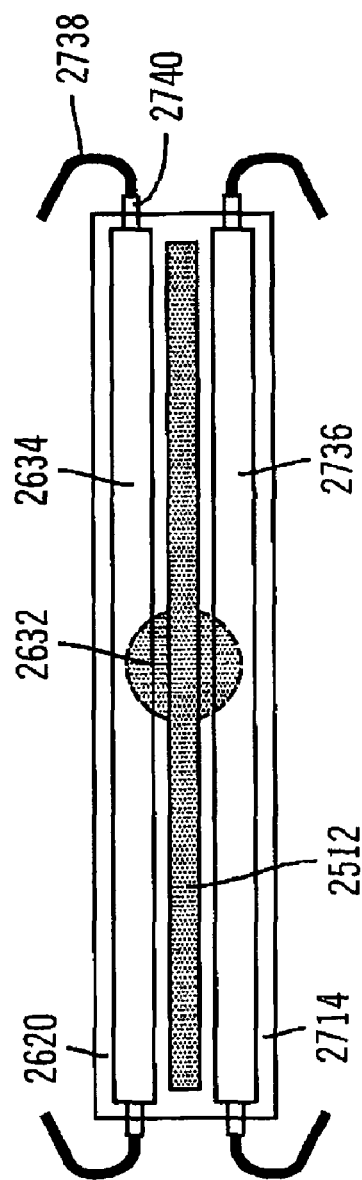
FIG. 26
FIG. 27

FILL HEAD FOR INJECTION MOLDING OF SOLDER

CROSS REFERENCE TO RELATED APPLICATION

The present patent application is a continuation of commonly owned U.S. patent application Ser. No. 11/409,233 filed Apr. 21, 2006, now U.S. Pat. No. 7,410,092; and is related to commonly owned U.S. patent application Ser. No. 11/409,242 now U.S. Pat. No. 7,649,869, entitled "Universal Mold For Injection Molding Of Solder"; U.S. patent application Ser No. 11/409,232 now U.S. Pat. No. 7,416,104, entitled "Rotational Fill Techniques For Injection Molding Of Solder"; and U.S. patent application Ser. No. 11/409,244 now U.S. Pat. No. 7,410,090, entitled "CONDUCTIVE BONDING MATERIAL FILL TECHNIQUES", all filed on even date with the present patent application, the entire collective teachings of which being hereby incorporated by reference.

FIELD OF THE INVENTION

The present invention generally relates to the field of placement of conductive bonding material such as solder on electronic pads, and more particularly relates to an apparatus for placement of the conductive bonding material.

BACKGROUND OF THE INVENTION

In modern semiconductor devices, the ever increasing device density and decreasing device dimensions demand more stringent requirements in the packaging or interconnecting techniques of such devices. Conventionally, a flip-chip attachment method has been used in the packaging of IC chips. In the flip-chip attachment method, instead of attaching an IC die to a lead frame in a package, an array of solder balls is formed on the surface of the die. The formation of the solder balls is normally carried out by through-mask evaporation, solder paste screening, or injection molding of solder.

U.S. Pat. No. 5,244,143, which is commonly owned by International Business Machines Corporation, discloses the injection molded solder (IMS) technique and is hereby incorporated by reference in its entirety. One of the advantages of the IMS over other solder bumping techniques is that there is very little volume change between the molten solder and the resulting solder bump. The IMS technique utilizes a solder head that fills boro-silicate glass (or other material) molds that are wide enough to cover most single chip modules. A wiper is sometimes provided behind the solder slit passes the filled holes of the mold to remove excess solder.

The IMS method for solder bonding is then carried out by applying a molten solder to a substrate in a transfer process. When smaller substrates, i.e., chip scale or single chip modules are encountered, the transfer step is readily accomplished since the solder-filled mold and substrate are relatively small in area and thus can be easily aligned and joined in a number of configurations. For instance, the process of split-optic alignment is frequently used in joining chips to substrates. The same process may also be used to join a chip-scale IMS mold to a substrate (chip) which will be bumped. One problem with current IMS systems are the fill heads uses to place solder in the cavities of the molds. These fill heads are restricted to linear deposition of solder into rectangular molds. That is, the mold and the solder head are moved linearly with respect to each other such that the cavities move perpendicular to a slit in the solder head thereby filling the cavities as they pass. Another problem with IMS is that the molds are limited to a rectangular configuration, which encourages the linear deposition of the solder.

Another problem with current fill heads used for IMS and other solder bumping techniques is that they do not provide precise temperature control with response time required to accurately control solder melt and solidification. Current fill heads are designed with resistive (electric) heaters in the solder head. The heater is built into the surface of the fill head where the head contacts the substrate being filled. The performance of a heater of this design is limited by a time delay for the heat to be generated in the line and then the conduction of the fill head. Also, there is a time delay for cooling of the solder in the cavities because the fill head does not provide a means for cooling the solder.

Therefore a need exists to overcome the problems with the prior art as discussed above.

SUMMARY OF THE INVENTION

Briefly, in accordance with the present invention, disclosed are a system, method, and apparatus for injection molding conductive bonding material into a plurality of cavities in a surface. The surface includes a plurality of cavities. The method further includes placing the fill head in substantial contact with the surface. At least a first gas is channeled about a first region of the fill head. The at least first gas having a temperature above a melting point of conductive bonding material residing in a reservoir mechanically coupled to the fill head thereby maintaining the conductive bonding material in a molten state as the conductive bonding material and the at least first gas are in close proximity to one another. The conductive bonding material is forced out of the fill head toward the surface. The conductive bonding material is provided into at least one cavity of the plurality of cavities contemporaneous with the at least one cavity being in proximity to the fill head.

In another embodiment of the present invention a system for injection molding conductive bonding material into a plurality of cavities in a surface is disclosed. The system comprises at least one surface including at least one cavity. The system also includes at least one conductive bonding material placement device for providing conductive bonding material into the at least one cavity of the at least one surface. The conductive bonding material placement device comprises a fill head and a conductive material reservoir. The fill head comprises at least a first gas channel situated about a first region of the fill head. The at least first gas channel is for channeling at least a first gas having a temperature above a melting point of the conductive bonding material thereby maintaining the conductive bonding material in a molten state as the conductive bonding material and the at least first gas are in close proximity to one another. The conductive material reservoir is mechanically coupled to the fill head for providing conductive bonding material to the fill head from the conductive material reservoir.

In yet another embodiment of the present invention a fill head for injection molding of conductive bonding material into a plurality of cavities in a surface is disclosed. The fill head comprises a reservoir for retaining conductive bonding material. A conductive bonding material channel that is mechanically coupled to the reservoir is also included. The fill head further includes a delivery slot that is situated perpendicular to the conductive bonding channel. The delivery slot accepts conductive bonding material from the reservoir via the conductive bonding material channel for providing the conductive bonding material to at least one cavity on a surface. The fill head also comprises at least a first gas channel situated about a first region. The at least first gas channel for channeling at least a first gas having a temperature above a melting point of conductive bonding material residing in a reservoir mechanically coupled to fill head thereby maintaining the conductive bonding material in a molten state as the conductive bonding material and the at least first gas are in close proximity to one another.

An advantage of the foregoing embodiments of the present invention is that a fill head that includes at least one gas channel is provided. The gas channel allows for a gas having a temperature above the melting point of the conductive bonding material to be retained within the fill head. The hot gas allows for the conductive bonding material to liquefy or become molten as it is provided to cavities of a mold. Another gas channel within the fill head allows for gas with a temperature below the melting point of the conductive bonding material to be retained within the fill head. This causes the conductive bonding material to solidify as it comes into contact with the gas.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

FIG. 26 is a cross-sectional view of a IMS fill head, according to an embodiment of the present invention;

FIG. 27 is a planar view of the IMS fill head of FIG. 23, according to an embodiment of the present invention;

DETAILED DESCRIPTION

Figure 1:
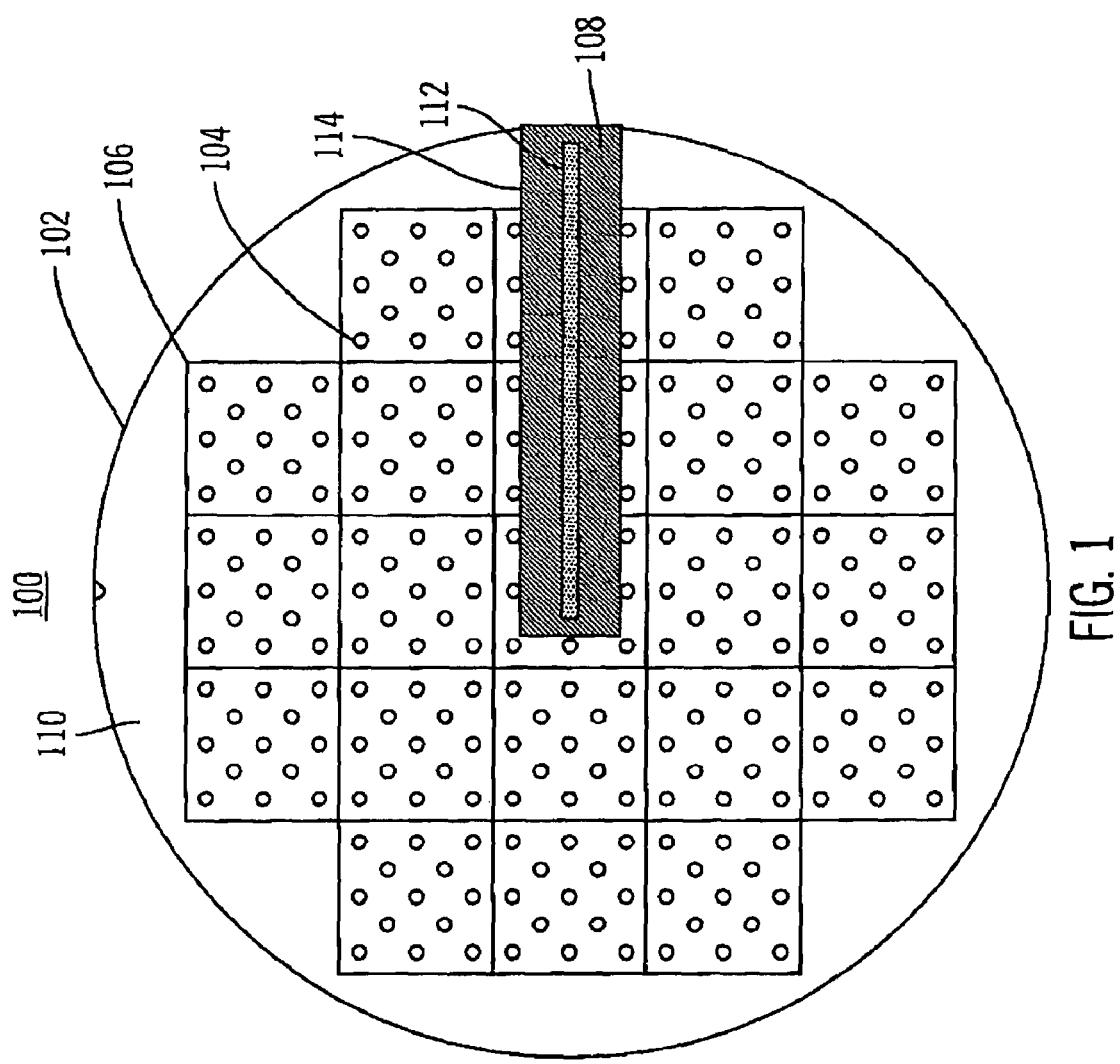
FIGS. 1-5 are top views of an IMS system illustrating a progressive sequence of filling cavities in a non-rectangular mold with conductive bonding material using a rotational fill technique that implements a fill head of a first type, according to an embodiment of the present invention.
Figure 2:
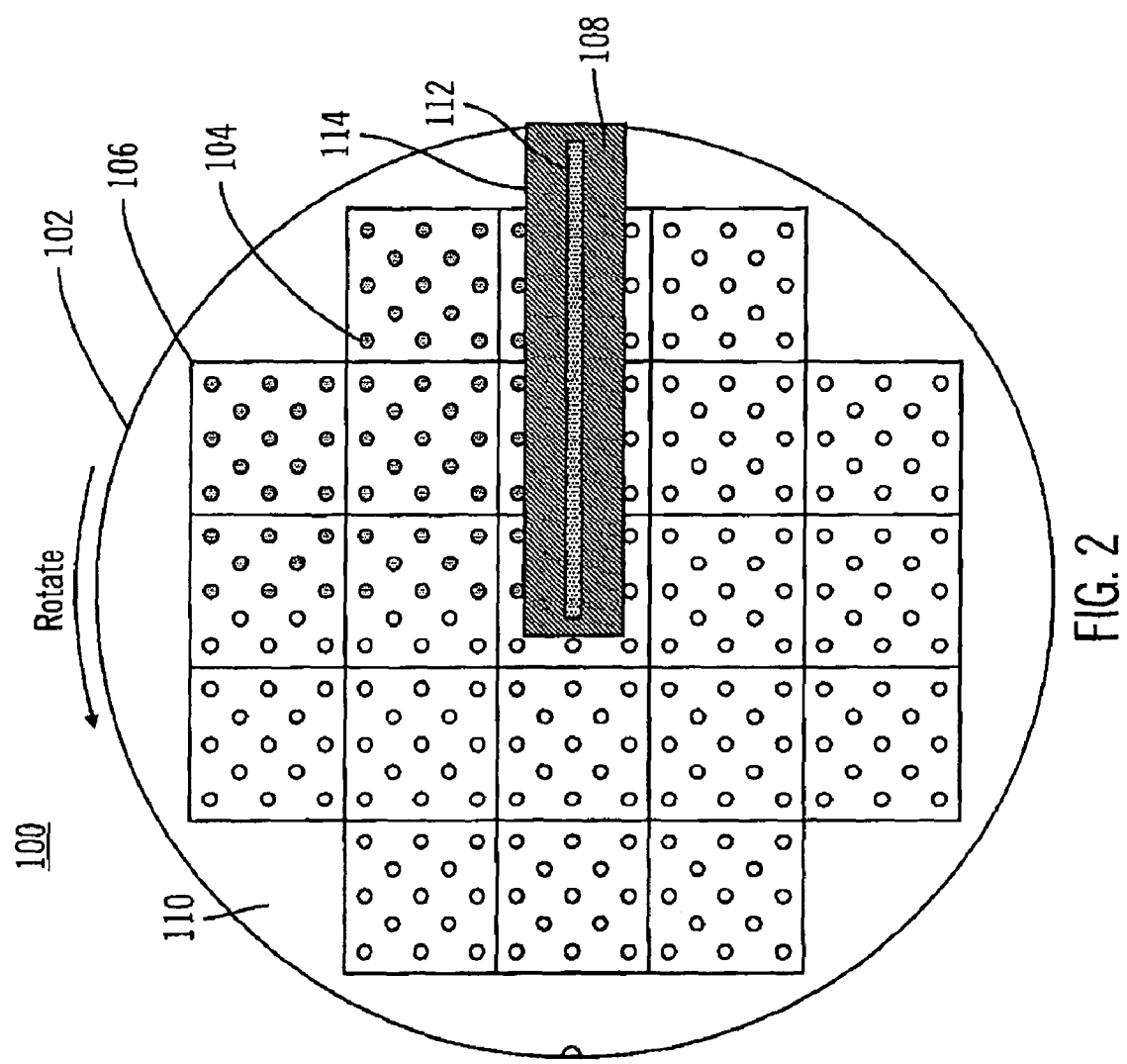
Figure 3:
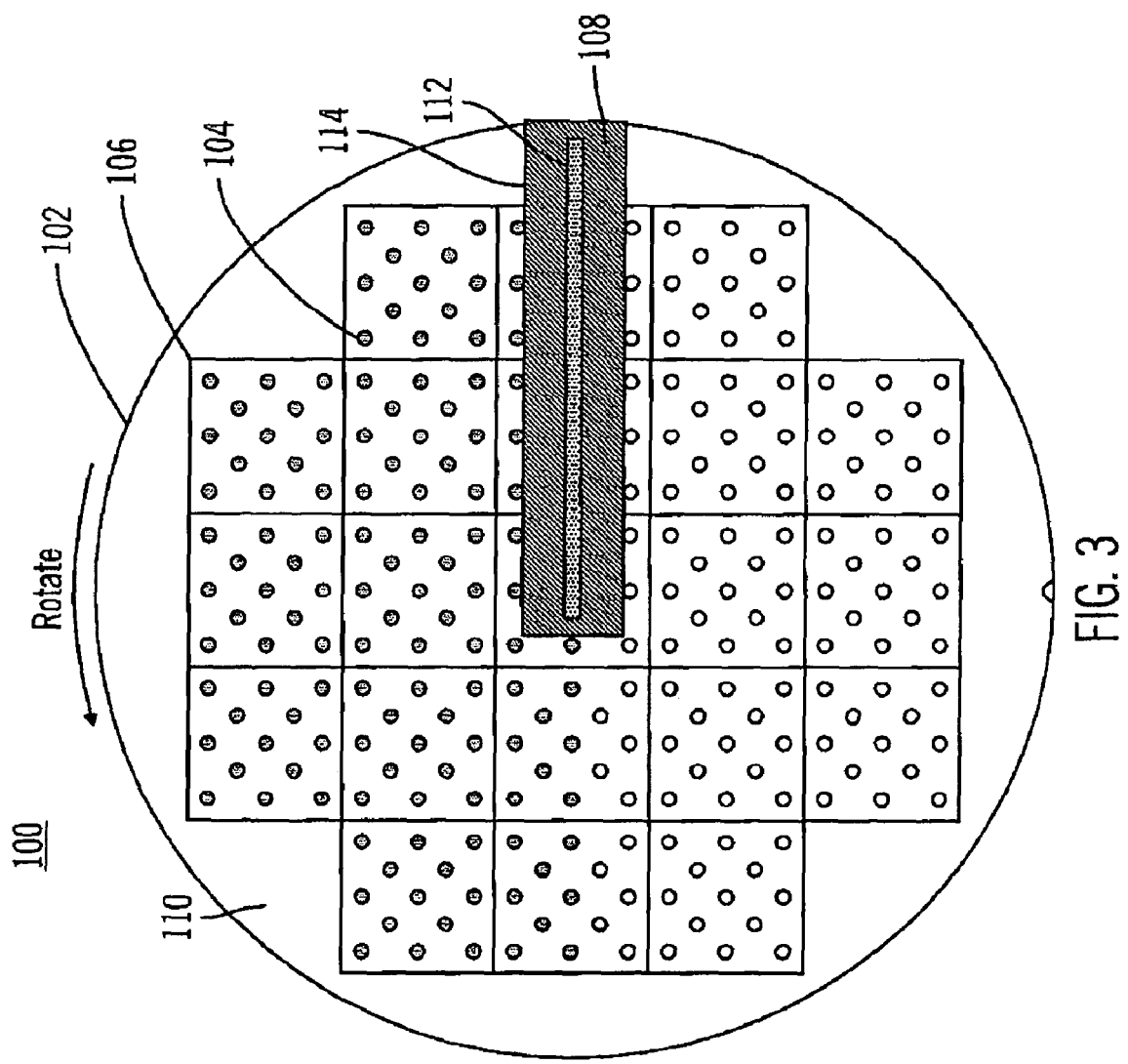
Figure 4:
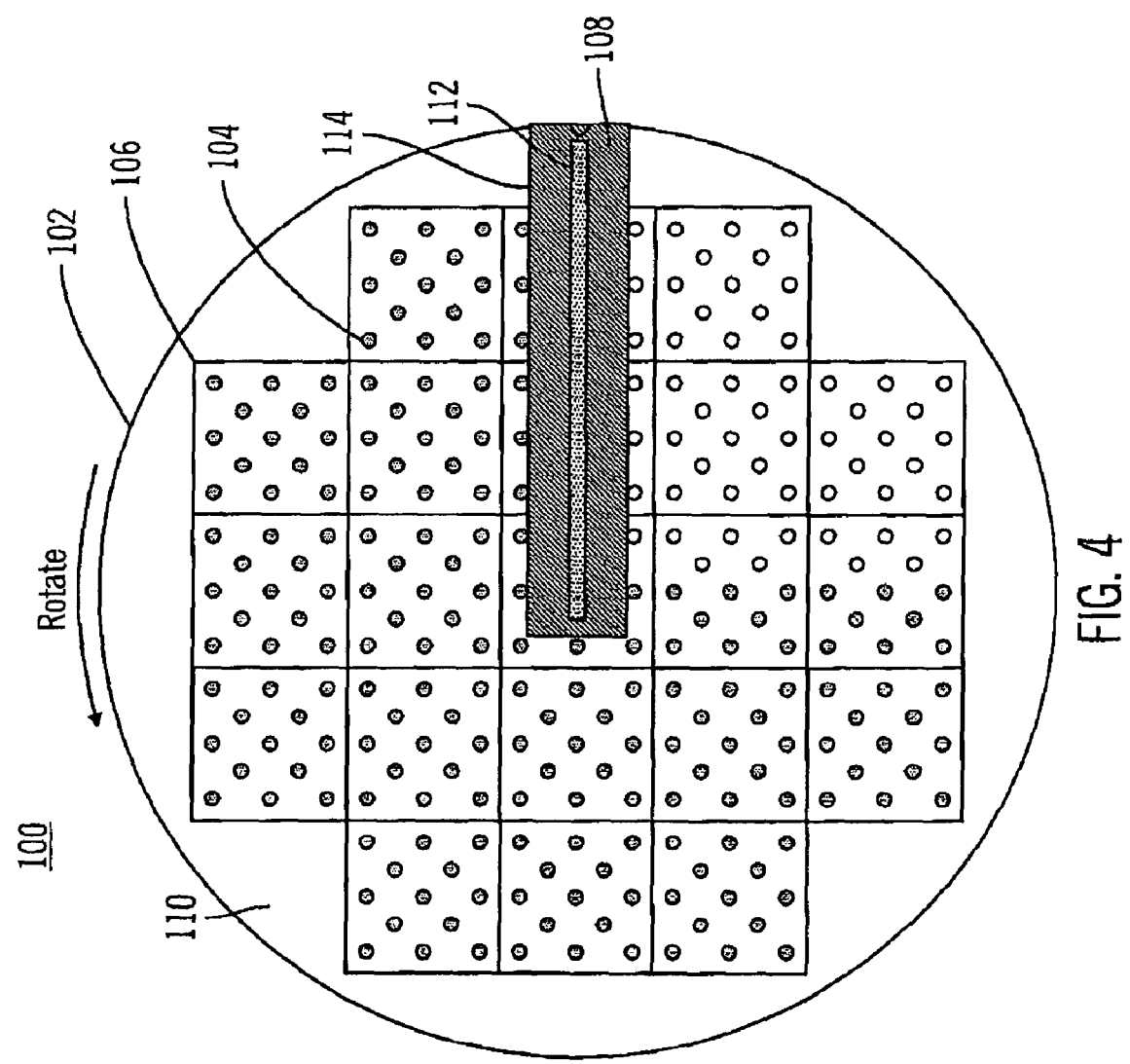
Figure 5:
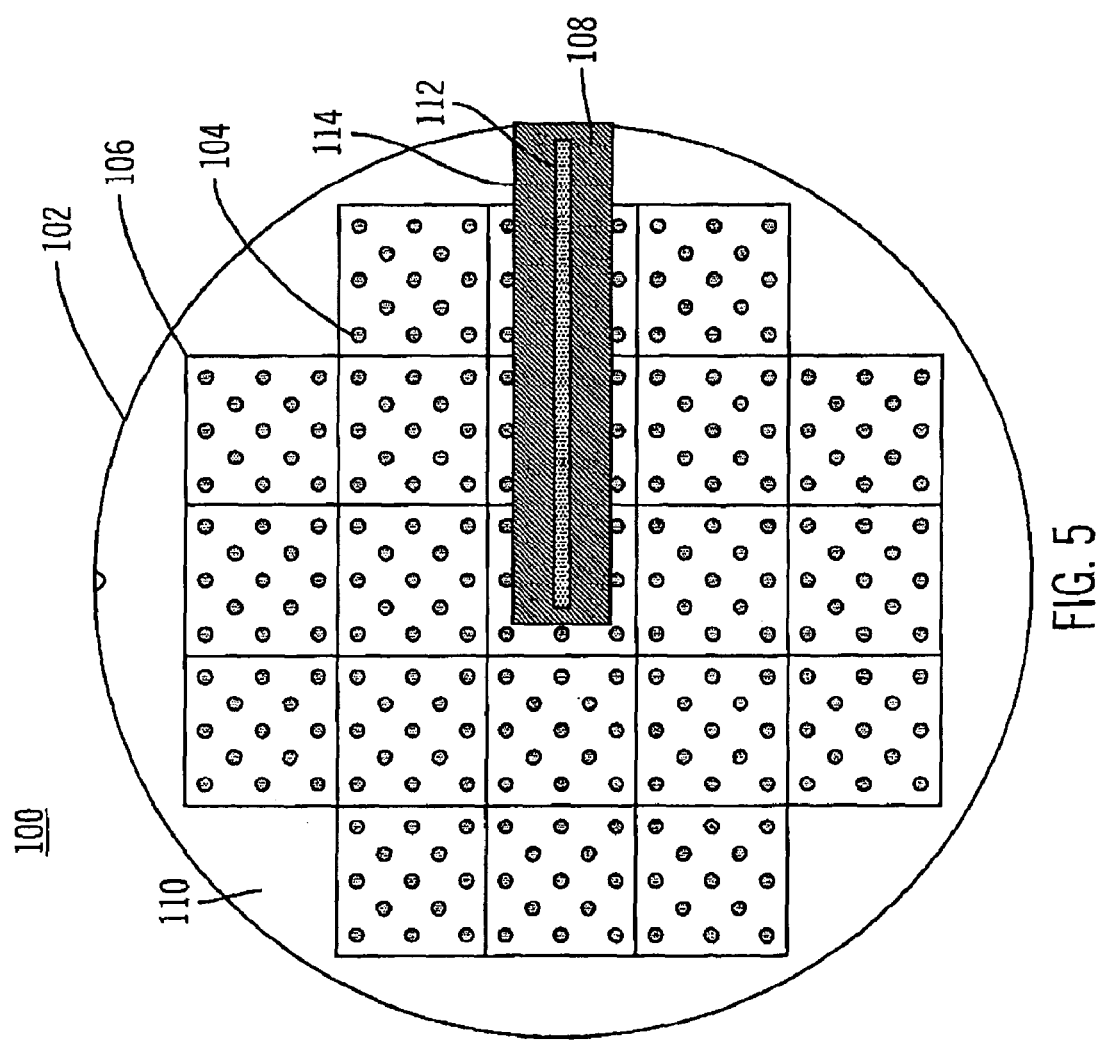
Figure 6:
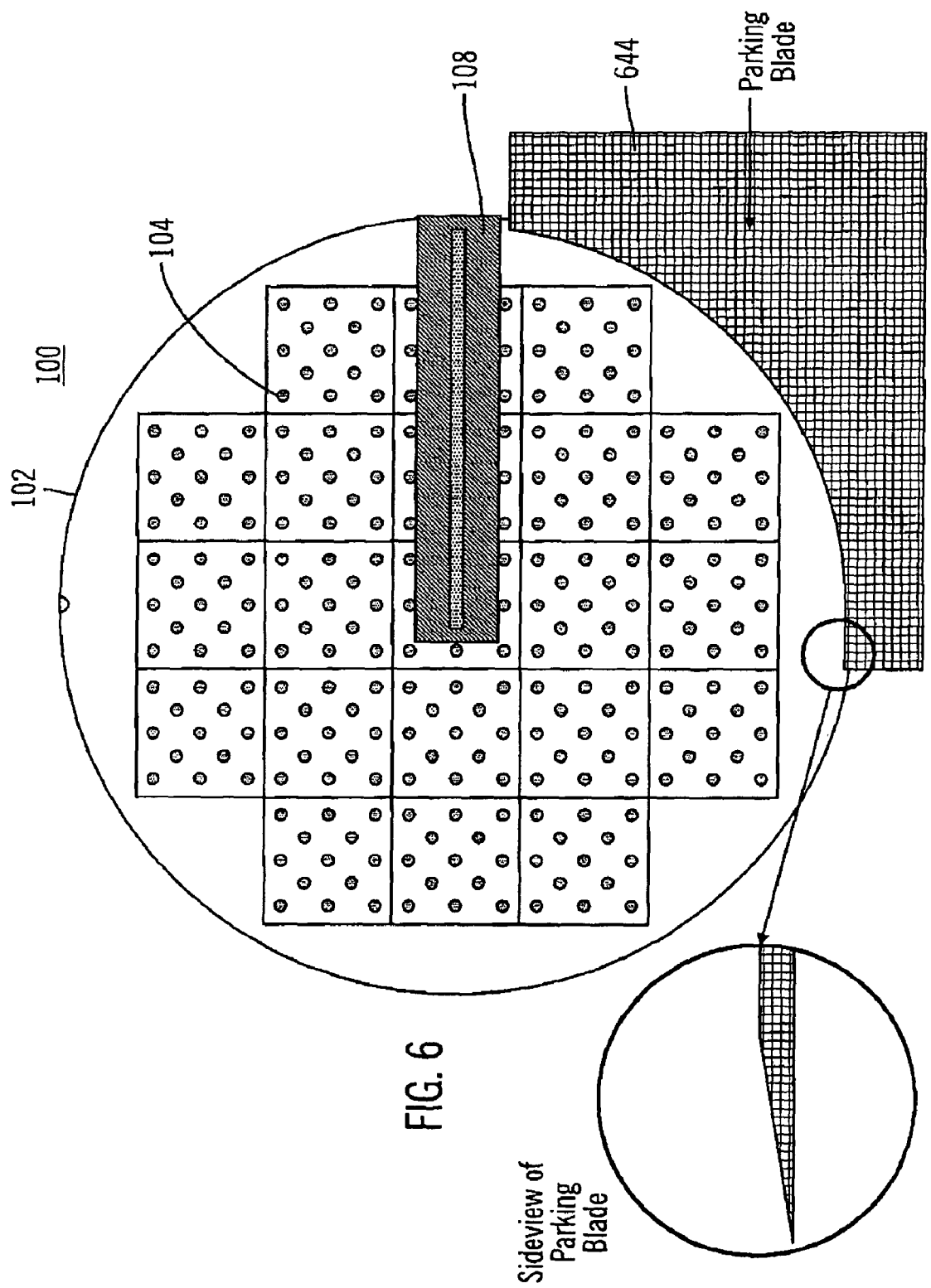
FIGS. 6-9 are top views of an IMS system illustrating a progressive sequence of transitioning the fill head of the first type from a non-rectangular mold after filling cavities in the mold with a conductive bonding material, according to an embodiment of the present invention.
Figure 7:
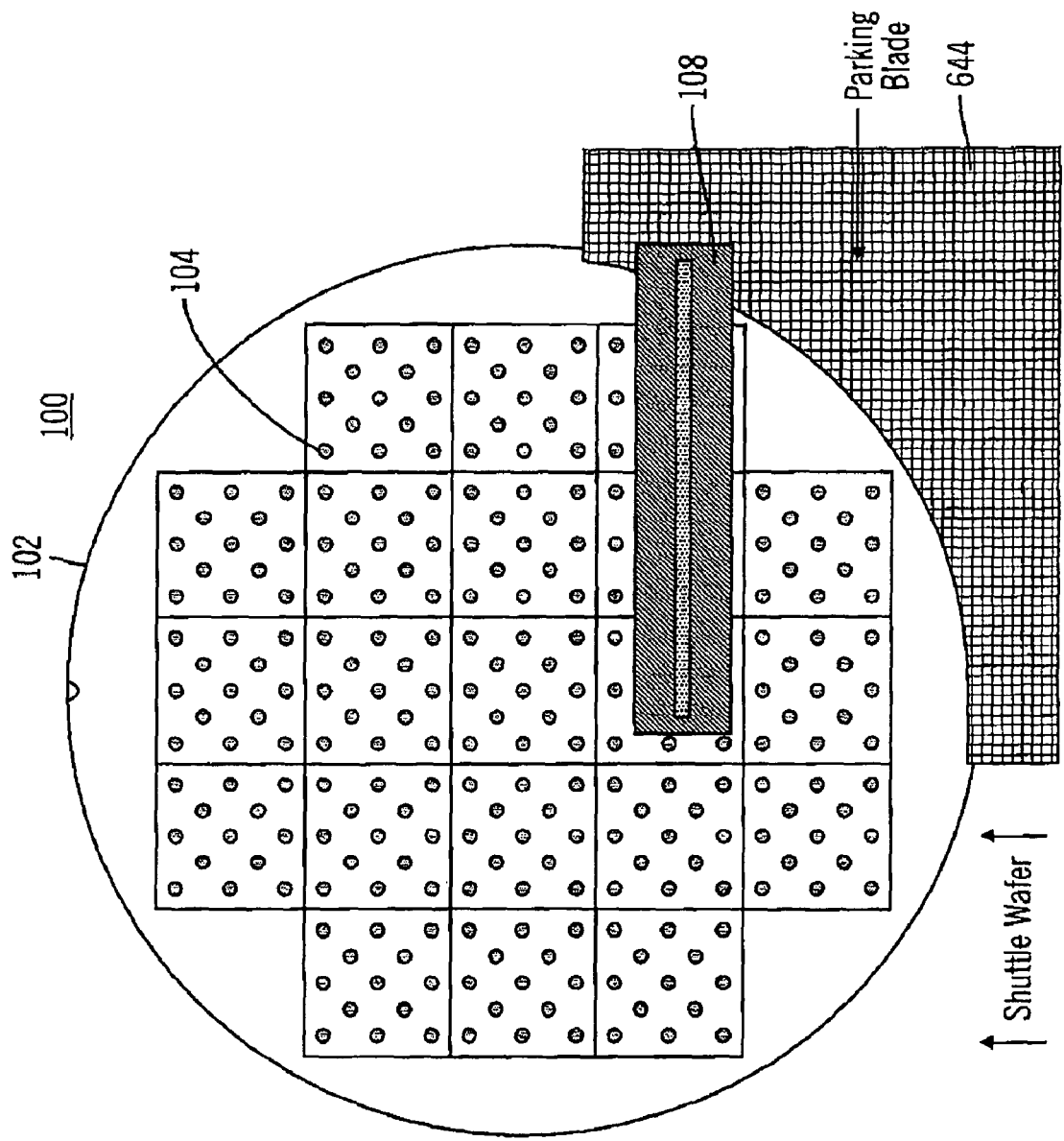

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

The present invention, according to an embodiment, overcomes problems with the prior art by providing a fill head that includes at least one gas channel. The gas channel allows for a gas having a temperature above the melting point of the conductive bonding material to be retained within the fill head. The hot gas allows for the conductive bonding material to remain molten as it is provided to cavities of a mold. Another gas channel within the fill head allows for gas with a temperature below the melting point of the conductive bonding material to be retained within the fill head. This causes the conductive bonding material to solidify as the fill head pass over the cavity retaining the conductive bonding material.

Exemplary IMS System for Rotational Fill Techniques

According to an embodiment of the present invention FIGS. 1-5 show a progressive sequence of an exemplary IMS system 100 utilizing rotational fill techniques. The exemplary IMS system 100 includes a non-rectangular mold 102. The non-rectangular mold 102, in one embodiment, is circular, however, other non-rectangular configurations may also be used according to the present invention. For example, the mold 102 may comprise oval, hexagonal, triangular, star, or any combination of these shapes. Although the foregoing embodiments are directed towards non-rectangular molds, the rotational fill techniques are also applicable to rectangular molds such as rectangular or square molds as well. In one embodiment, the non-rectangular mold 102 corresponds to a silicon wafer. In this embodiment, the non-rectangular mold 102 is comprised of borosilicate glass. In another embodiment, the non-rectangular mold 102 is comprised of glass, silicon, metal, or the like. In one embodiment, the material used to create the non-rectangular mold 102 should have the same coefficient of thermal expansion as the wafer material. For example, borosilicate glass has the same coefficient of thermal expansion as a silicon wafer. However, in another embodiment, a material such as molybdenum is used, which has a very different coefficient of thermal expansion than the wafer material.

The non-rectangular mold 102 comprises a plurality of cavities 104 corresponding to wetting pads (not shown) on a wafer (not shown). The square boundaries 106 represent chip boundaries and are for illustrative purposes only. In one embodiment, the cavities 104 are formed by applying polyimide to the borosilicate glass surface. The polyimide layer is then laser processed to produce cavities 104 in the polyimide layer only. In another embodiment, wet etching is used to form the cavities 104. However, the present invention is not limited to these two processes for forming cavities as should be well understood by those of ordinary skill in the art in view of the present discussion.

A fill head 108 is also included in the IMS system 100. The fill head 108, in one embodiment, is made from glass, metal, graphite, or the like. The fill head 108 is configured so that it scans smoothly over a surface 110 of the non-rectangular mold 102, or alternatively so that the mold 102 scans under the head. An exemplary fill head 108 has a smooth coating (not shown) on the surface of the fill head 108 facing the mold 102 of the fill head 108 with a low friction coefficient to ensure smooth scanning over the non-rectangular mold 102. A reservoir (not shown) is coupled to the fill head 108 for retaining material to be provided to the cavities 104 via the fill head 108. For example, a conductive organic material such as a conductive epoxy, a solder paste, an adhesive impregnated with conductors (e.g. metal particles), or the like is retained within the reservoir (not shown).

Throughout this disclosure the term solder will be used as an example of the type of material to be deposited into the cavities 104. The fill head 108 also includes a delivery slot (or slit) 112 that allows solder material to flow from the reservoir (not shown) into the cavities 104. The fill head 108 in one embodiment also includes at least one gas channel (not shown) comprising a gas having a temperature above the melting point of the solder. This causes the solder from the fill head 108 to more fully liquefy (melt) and to flow into the cavities 104. The fill head 108 will be discussed in greater detail below.

An optional fill blade (not shown), in one embodiment, is optionally coupled to the fill head 108. The optional fill blade (not shown) is situated on a portion of the fill head 108 that is in contact with the surface 110 of the mold. The optional fill blade (not shown) is situated so that the cavities 104 are filled prior to passing under the optional fill blade (not shown). The optional fill blade (not shown) prevents solder from leaking beyond the delivery slot (or slit) 112 as solder is provided to the cavities 104. When the optional fill blade (not shown) is situated against the surface 110 of the non-rectangular mold 102 a seal is created that allows air within the cavities to escape. The optional fill blade (not shown) is comprised of either a flexible or rigid material. If a optional fill blade is not coupled. In another embodiment, the fill head 108 itself acts a optional fill blade. For example, a bottom surface of the fill head 108, which in one example is flat and smooth, is applied to the mold with enough pressure as to exhibit a squeegee effect across the mold.

FIGS. 1-5 show a fill head 108 situated along a radius of the non-rectangular mold 102. In one embodiment, the fill head 108 is slightly longer than the radius of the non-rectangular mold 102. FIGS. 2-5 show the IMS system 100 in 45 degree increments as either the fill head 108 is rotated about the center of the mold 102 or the non-rectangular mold 102 is rotated about its center, or both. It should be noted that rotational motion can be imparted to one or both of the non-rectangular mold 102 and the fill head 108. For example, the non-rectangular mold 102, in one embodiment, is rotated up to 360 degrees while the fill head 108 remains stationary. In another embodiment, the fill head 108 is rotated up to 360 degrees while the non-rectangular mold 102 remains stationary. In yet another embodiment, both the non-rectangular mold 102 and the fill head 108 are rotated relative to each other.

The rotational motion, in one embodiment, is continuous so that the non-rectangular mold 102 and/or the fill head 108 smoothly rotates without stopping. In another embodiment, the rotational force is applied in increments. Although the rotation is shown in a counter clockwise manner, the rotational motion can also be applied in a clockwise manner. Throughout this disclosure, an exemplary embodiment will be described wherein the fill head 108 remains stationary while the non-rectangular mold 102 is rotated. Additionally, even though in this example a single non-rectangular mold 102 and a single fill head 108 are shown, it should be understood by those of ordinary skill in the art in view of the present discussion that multiple non-rectangular molds 102 and/or multiple fill heads 108 can be combined in a system according to the present invention. Additionally, it should be understood that the non-rectangular mold 102 can be situated above or below the fill head 108, according to the present invention.

As the non-rectangular mold 102 is rotated about its center, the cavities 104 pass under the delivery slot (or slit) 112. Back pressure is applied to the solder in the reservoir (not shown) by, for example, injecting a gas such as nitrogen or argon into the reservoir (not shown). The back pressure forces molten solder to flow from the reservoir (not shown) to the delivery slot (or slit) 112 whereby the molten solder exits to the surface 110 of the non-rectangular mold 102. The fill head 108 remains in substantial contact with the surface 110 of the non-rectangular mold 102 as the non-rectangular mold 102 rotates. In one embodiment, the molten solder is directly deposited to a substrate itself such as a circuit supporting substrate without using a mold 102. In this embodiment, the substrate is non-rectangular and has cavities similar to the cavities 104 on the mold 102. The same procedure as described above with respect to the mold 102 is applicable when directly depositing solder onto a non-rectangular substrate.

The optional filling blade (not shown), which is also in substantial contact with the surface 110, exhibits a squeegee effect and guides the molten solder into the cavities 104 of the non-rectangular mold 102. Filled cavities are represented by the darkened circles in FIGS. 2-5. The fill head 108, according to one embodiment, also includes at least one gas channel (not shown) comprising a gas with a temperature below the melting point of the solder. This causes the molten or liquefied solder to solidify in the cavity 104 as the cavity passes under a trailing edge 114 of the fill head 108. The fill head 108 will be discussed in greater detail below.

One advantage of the present invention is the ability to fill non-rectangular molds with solder. Current IMS systems operate in a linear manner. That is, the mold and fill head move in a linear direction with respect to each other. Non-rectangular molds such as circular molds are desirable for use with circular wafers. The rotational fill techniques of the present invention allow non-rectangular molds such as circular molds to be filled without adapters. For example, prior art techniques place rectangular adapters on circular molds and scan a fill head in a linear direction across the mold.

After the non-rectangular mold 102 has been rotated up to 360 degrees all of the cavities 104 are filled. The fill head 108 then can transition to an adjacent mold (not shown). In one embodiment, as the fill head 108 is transitioning from mold to mold, the back pressure is released thereby causing the solder to retract back from the delivery slot (or slit) 112. However, in some instances the fill head 108 or a portion of the fill head 108 will extend beyond the non-rectangular mold 102 thereby exposing the delivery slot (or slit) 112 as it is transitioning. This can result in solder leaking out of the fill head either comprising the filled cavities and/or wasting the solder. To avoid this problem a parking blade 644, in one embodiment, is coupled to the edges of the non-rectangular mold 102 where the fill head 108 transitions to the next non-rectangular mold 102.

Figure 8:
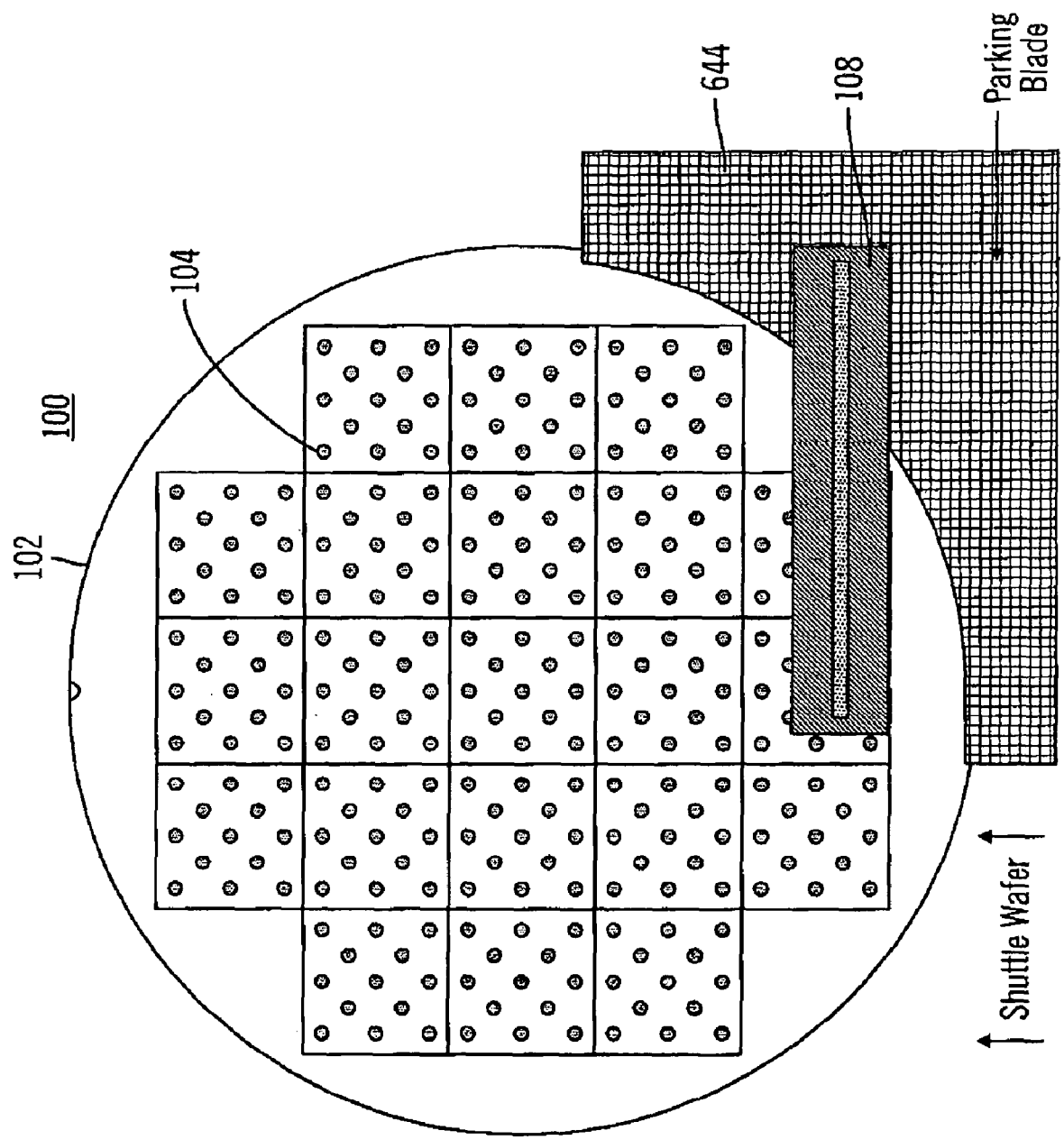
Figure 9:
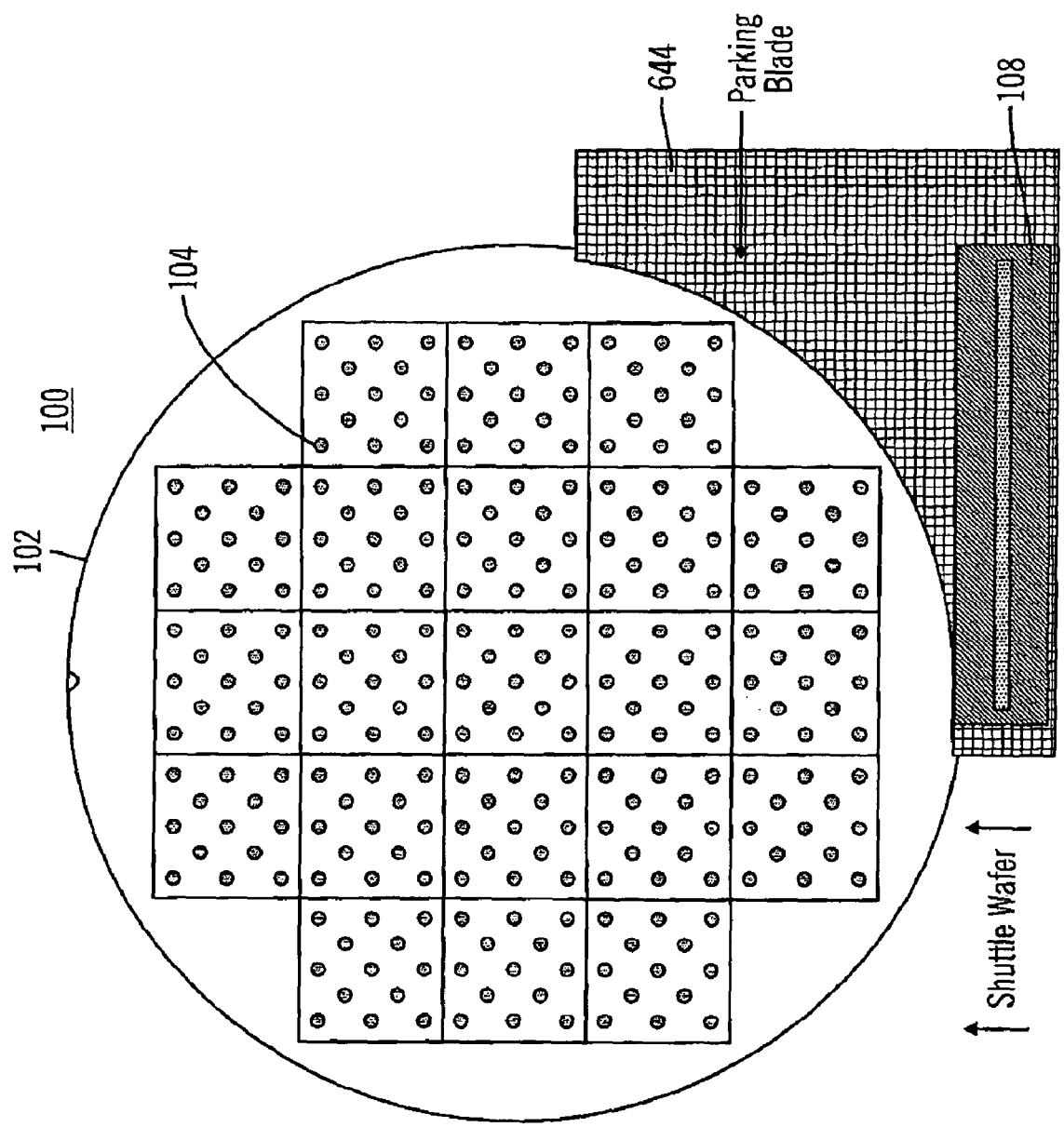

FIGS. 6-9 illustrate the embodiment where a parking blade 602 is coupled to the non-rectangular mold 102. Once the cavities 104 on the non-rectangular mold 102 have been filled with solder, the non-rectangular mold 102 is shuttled so that the fill head 108 transitions to the next mold (not shown). As the non-rectangular mold 102 is shuttled, a portion of the fill head 108 or the entire fill head 108 extends beyond the non-rectangular mold 102 as shown in FIGS. 8 and 9. The fill head 108 remains in substantial contact with the parking blade 602 thereby preventing spillage of the solder.

Exemplary IMS System Utilizing a Fill Head of a Second Type

Figure 10:
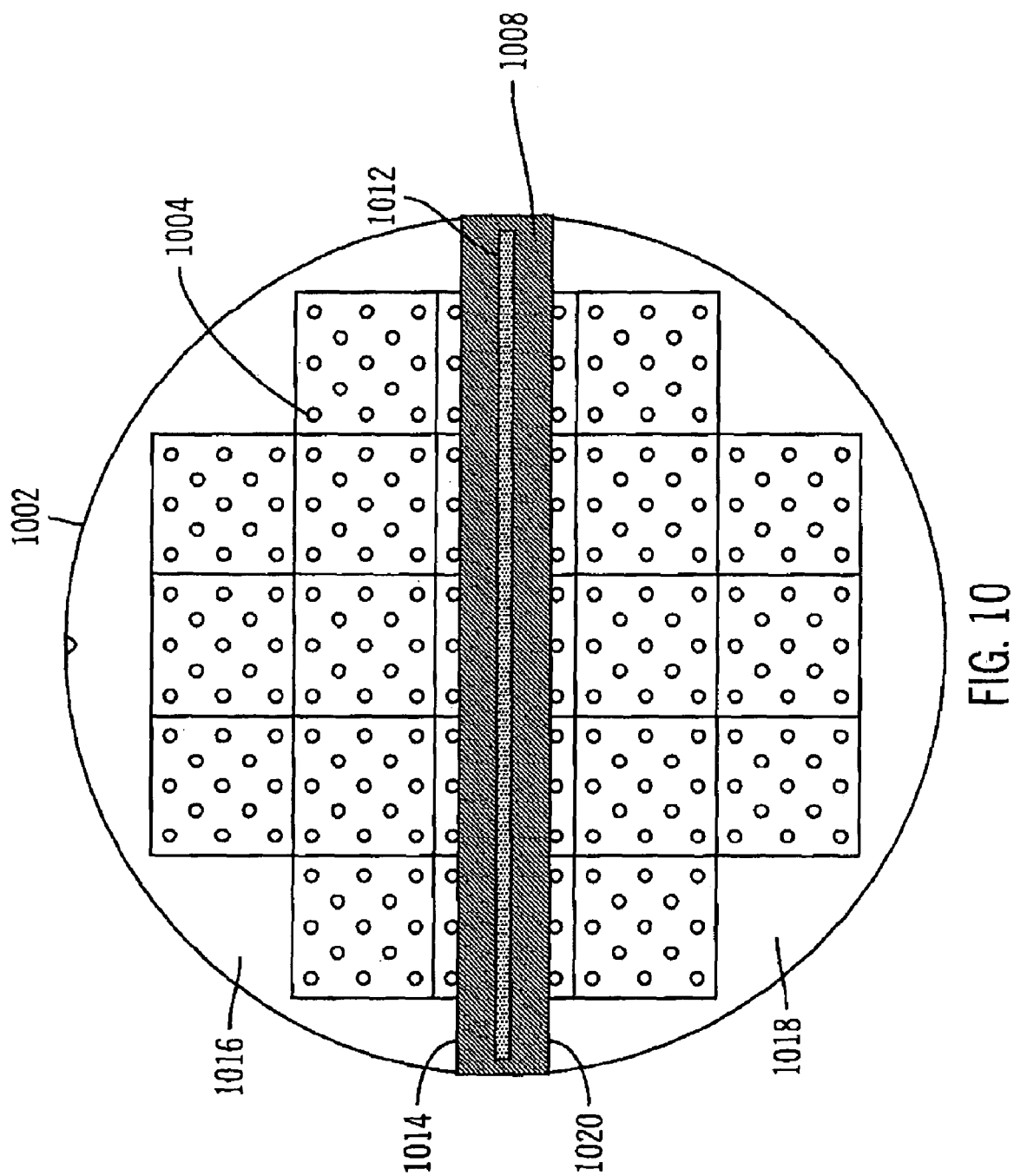
FIGS. 10-12 is are top views of an IMS system illustrating a progressive sequence of filling cavities in a non-rectangular mold with a conductive bonding material using a rotational fill technique that implements a fill head of a second type, according to an embodiment of the present invention.
Figure 11:
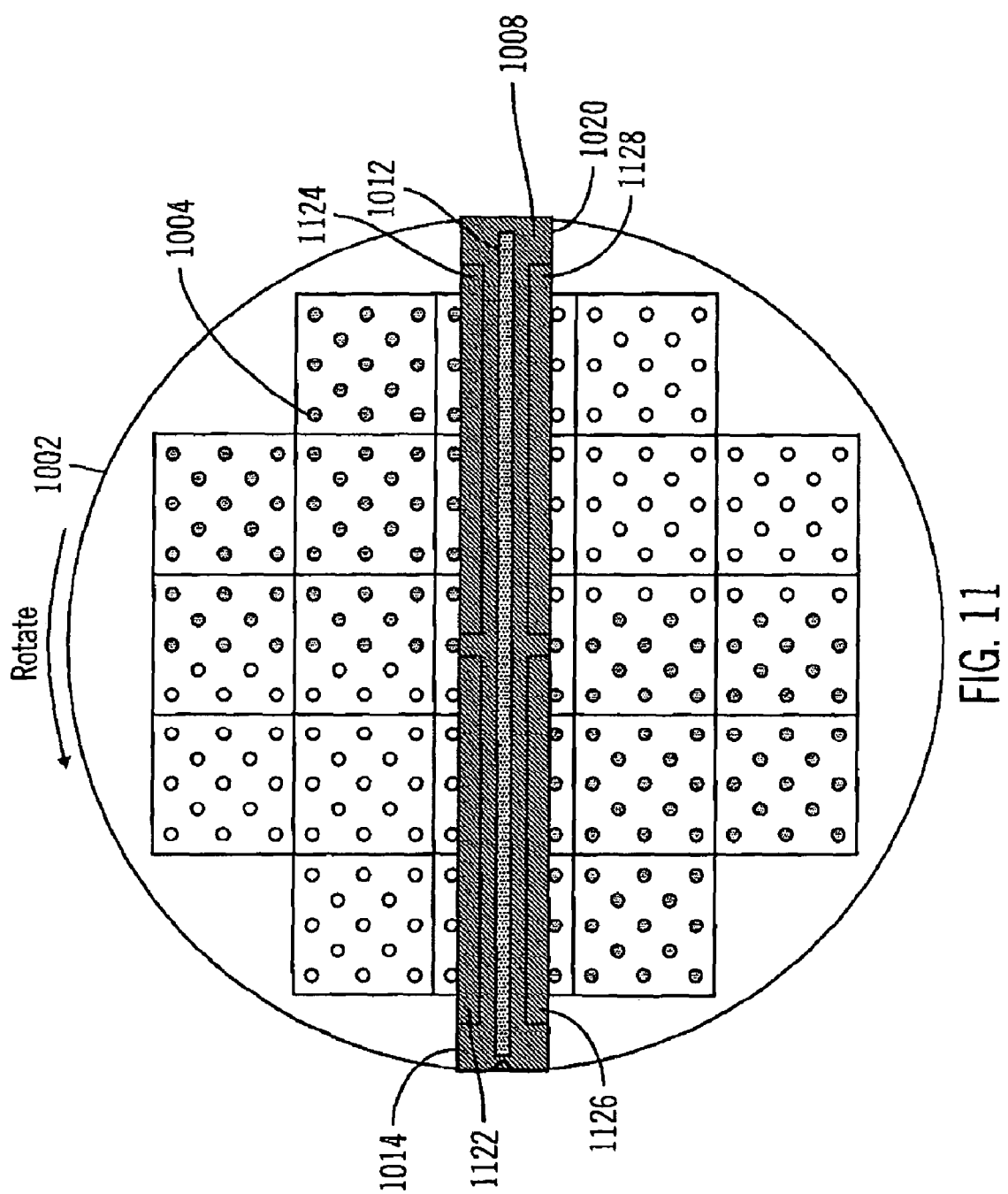
Figure 12:
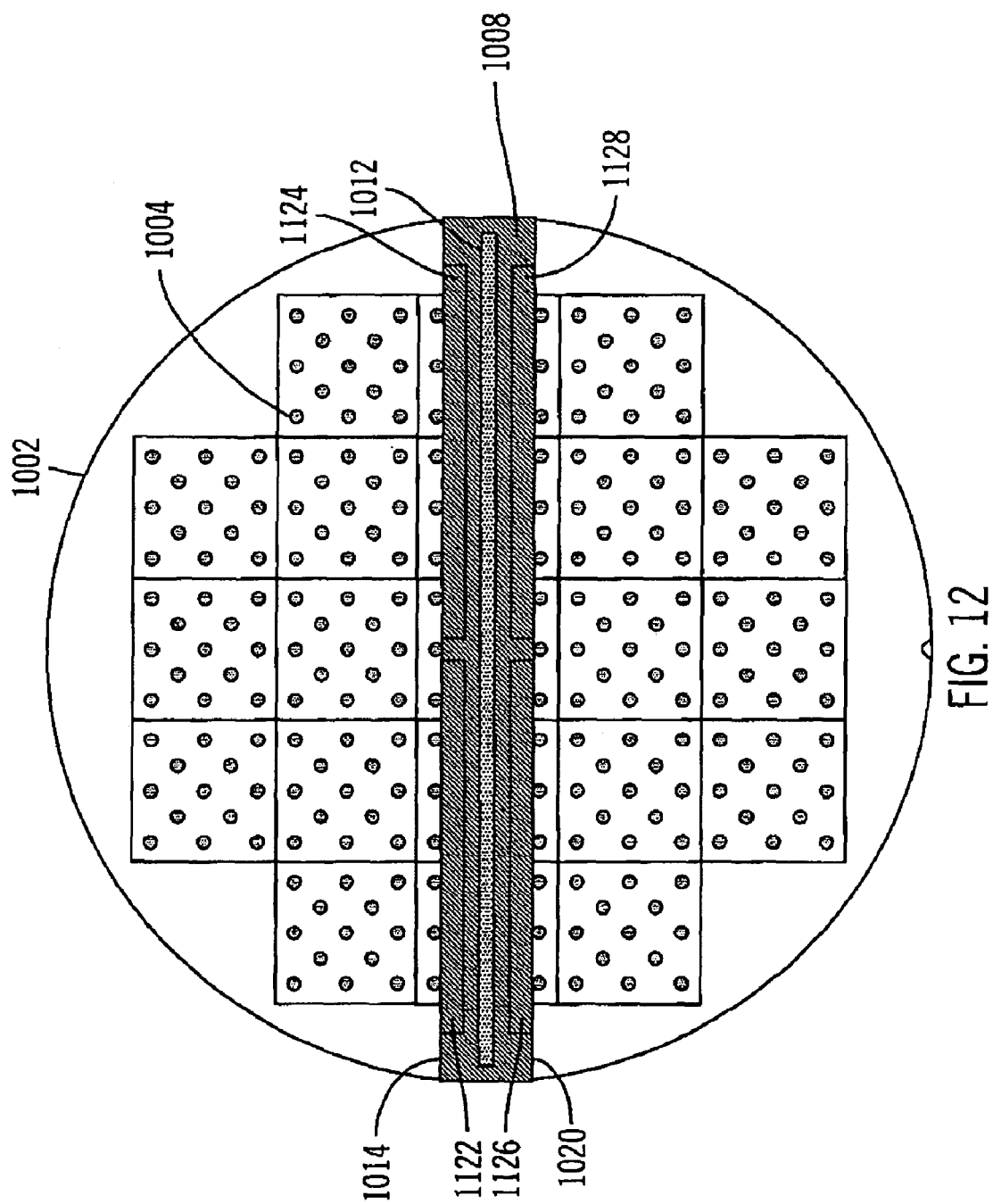

FIGS. 10-12 illustrate another embodiment of the present invention wherein the fill head 1008 is slightly longer than a diameter of the non-rectangular mold 1002. FIGS. 10-12 show a progressive sequence at 90 degree intervals of the non-rectangular mold 1002 being rotated up to 180 degrees. The fill head 1008 is aligned along the diameter of the non-rectangular mold 1002. As the non-rectangular mold 1002 is rotated about its center, molten solder flows from the delivery slot 1012 and onto the surface 1010 of the non-rectangular mold. As the non-rectangular mold 1002 is rotated, the optional filling blade (not shown) guides the molten solder into the cavities 1004. In this embodiment, the fill head 1008 is bi-directional. In other words, the fill head 1008 fills the cavities 1004 in two directions. For example, cavities 1004 situated on the upper half 1016 of the non-rectangular mold 1002 are filled from an opposite direction as the cavities 1004 situated on the bottom half 1018 of the non-rectangular mold 1002.

The non-rectangular mold 1002 only needs to be rotated up to 180 degrees in order for all of the cavities 1004 to be filled. Therefore, one advantage of the present invention is that the fill time of cavities 1004 is controllable by using different fill heads 108, 1008. In one embodiment, the fill head 1008 includes a set of gas channels 1122, 1124, 1126, 1128 (FIG. 11) on a first edge 1014 and a second edge 1020 of the fill head 1008. For example, FIGS. 11-12 show a first gas channel 1122 and a second gas channel 1124 on a first edge 1014 of the fill head 1008 and a third gas channel 1126 and a fourth gas channel 1128 on a second edge 1020 of the non-rectangular mold 1002. In one embodiment, the first and fourth gas channels 1122, 1128 include a gas with a temperature above the melting point of the solder and the second and third gas channels 1126 include a gas having a temperature below the melting point of the solder. This configuration of the gas channels 1122, 1124, 1126, 1128 allows for the cavities 104 to be filled in a counter clockwise direction and have the molten solder solidified in the cavities as the pass under the opposite edge of the fill head 108 The gas channels 1122, 1124, 1126, 1128 are inversed when the rotation is clockwise. In another embodiment the first and fourth gas channels 1122, 1128 and the second and third gas channels 1126, 1128 are mechanically coupled to each other, respectively.

Figure 13:
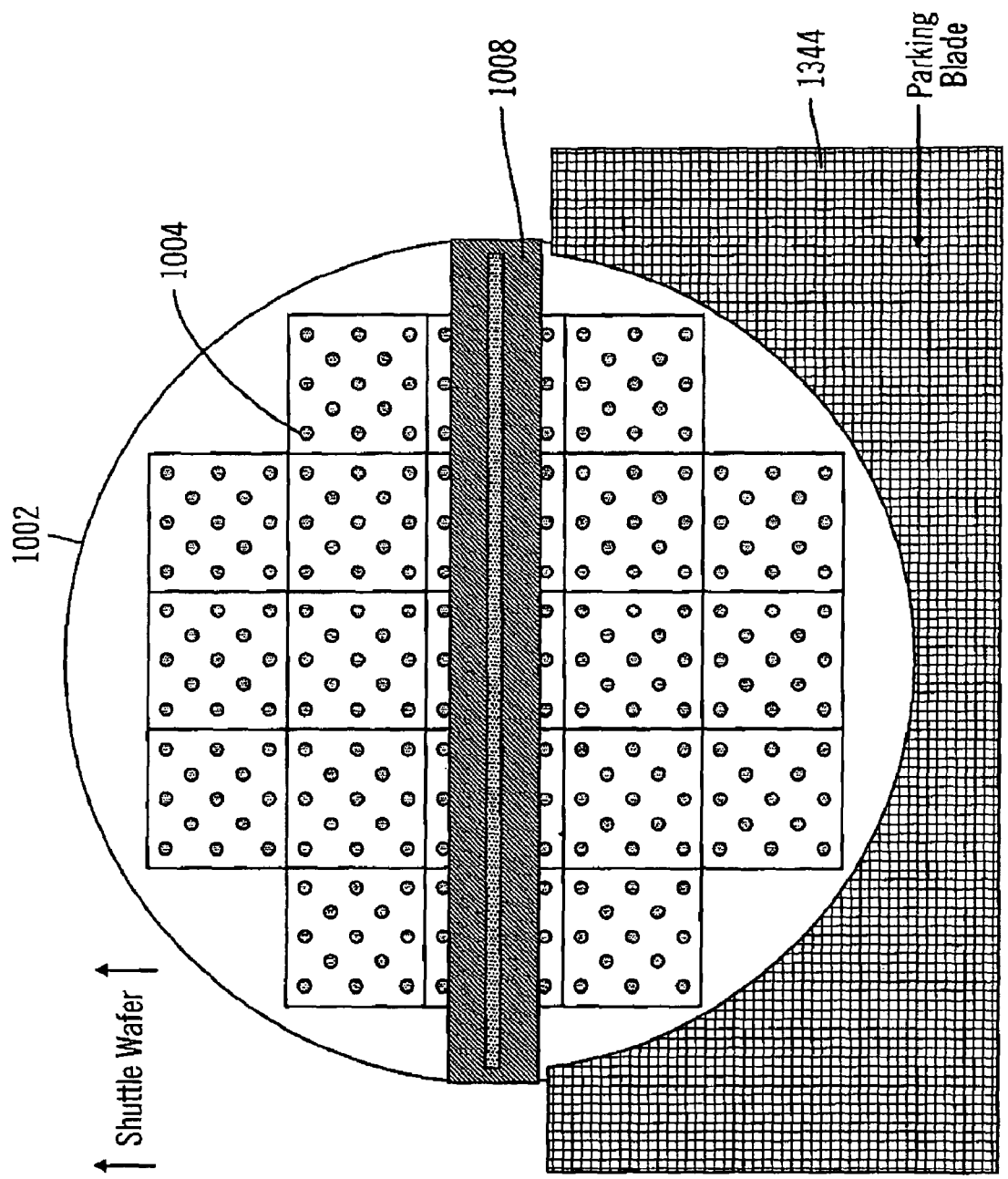
FIGS. 13-15 are top views of an IMS system illustrating a progressive sequence of transitioning the fill head of the second type from a non-rectangular mold after filling cavities in the mold with a conductive bonding material, according to an embodiment of the present invention.
Figure 14:
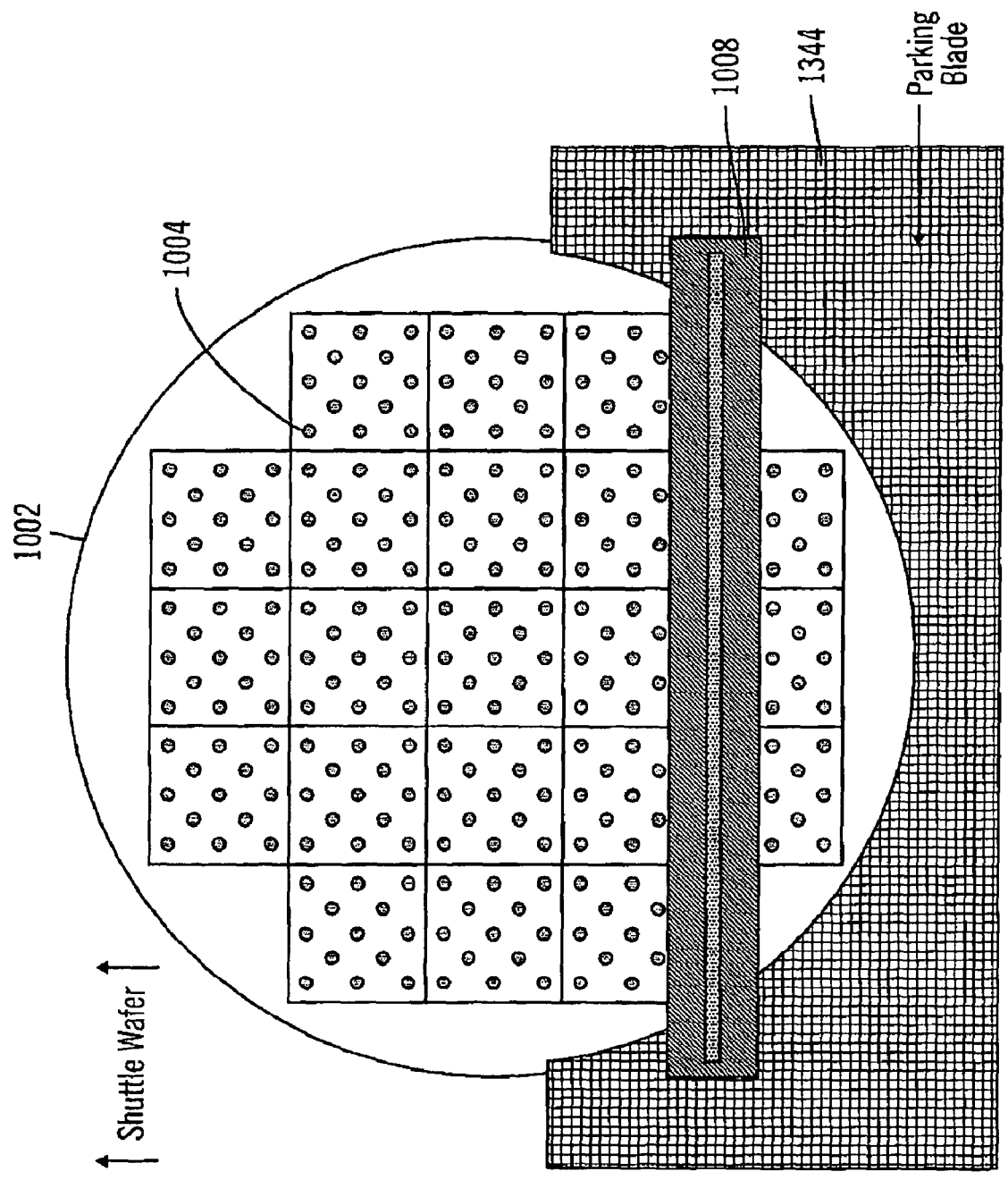
Figure 15:
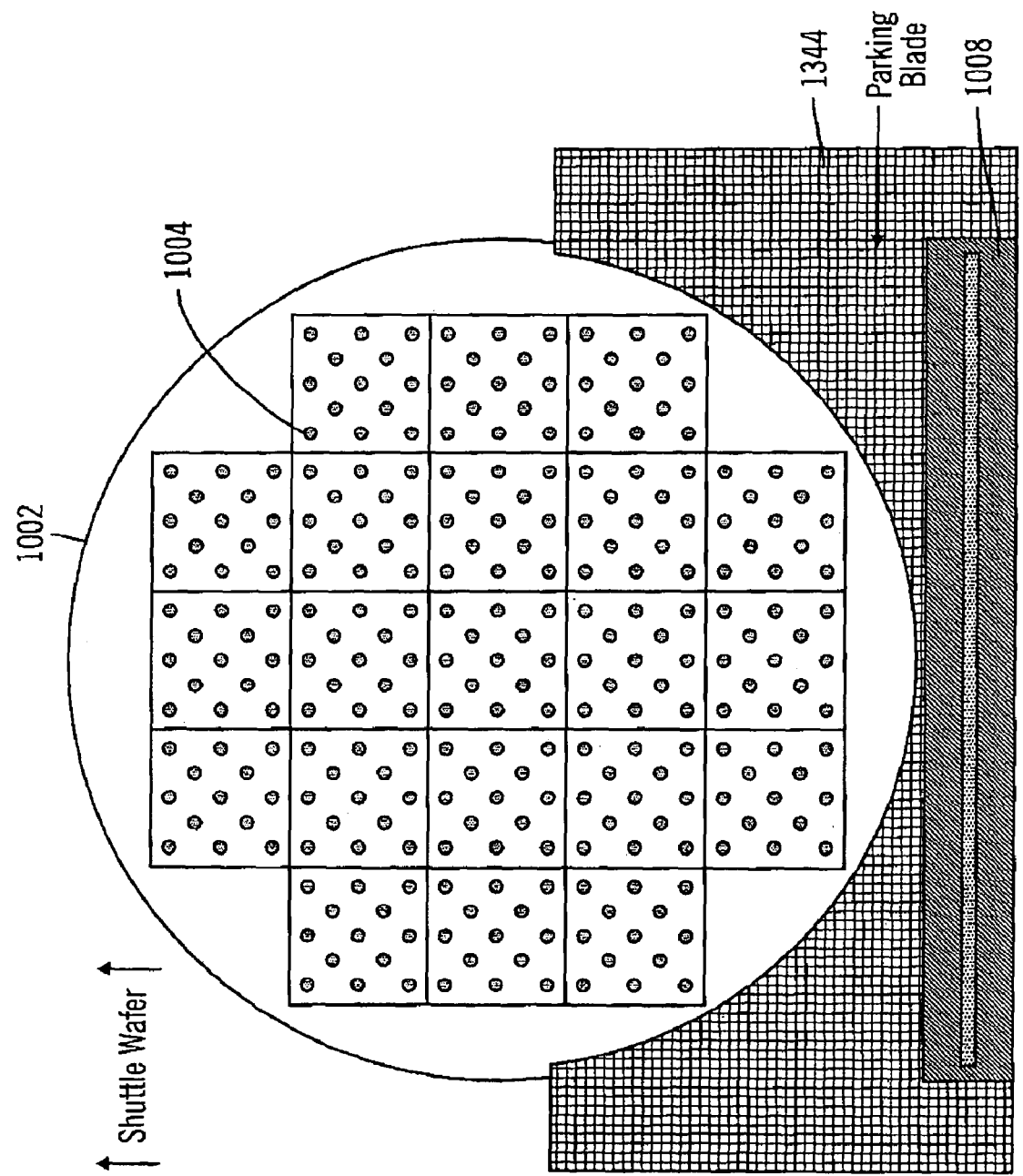
Figure 16:
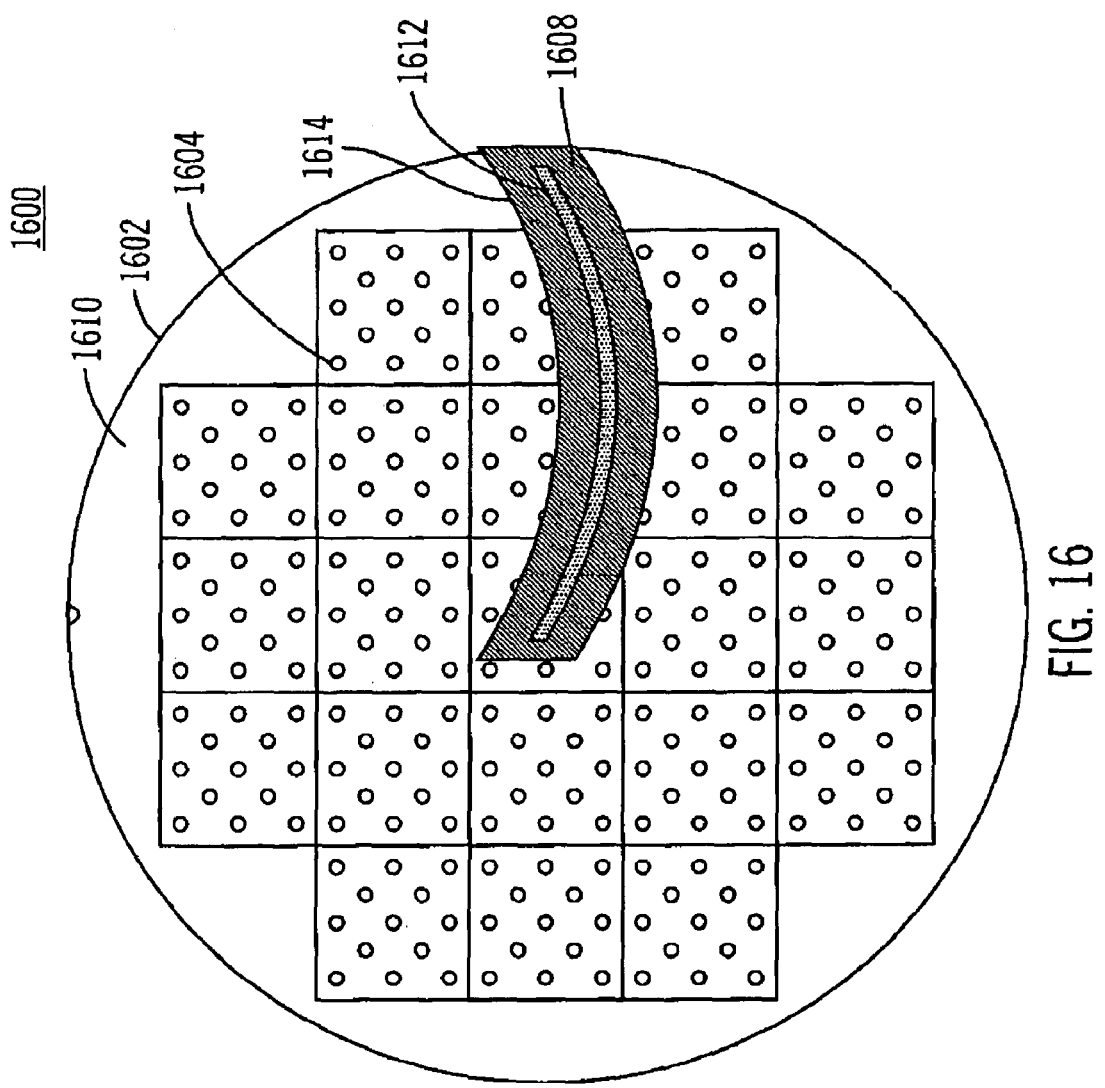
FIGS. 16-20 are top views of an IMS system illustrating a progressive sequence of filling cavities in a non-rectangular mold with a conductive bonding material using a rotational fill technique that implements a fill head of a third type, according to an embodiment of the present invention.
Figure 17:
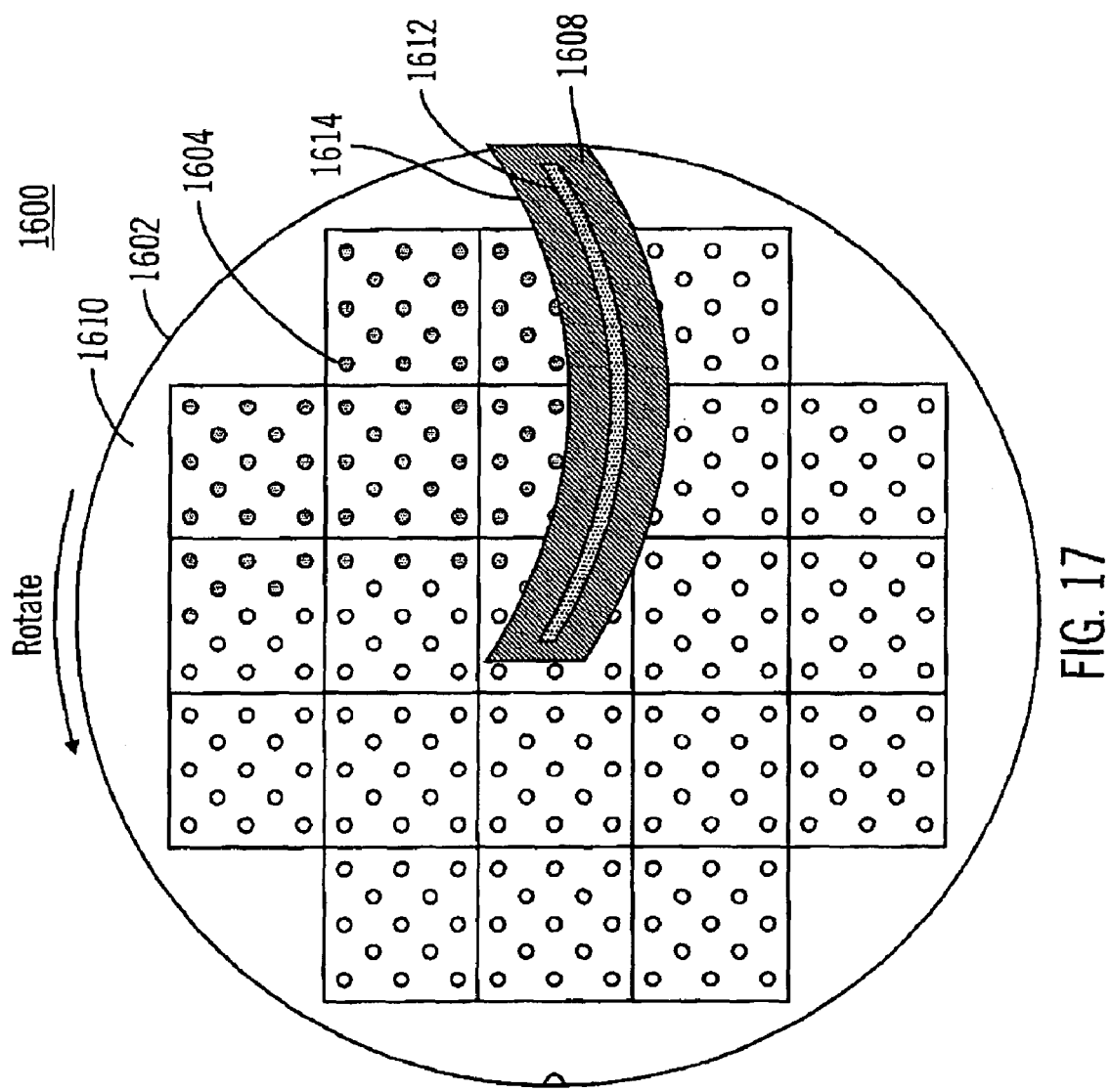
Figure 18:
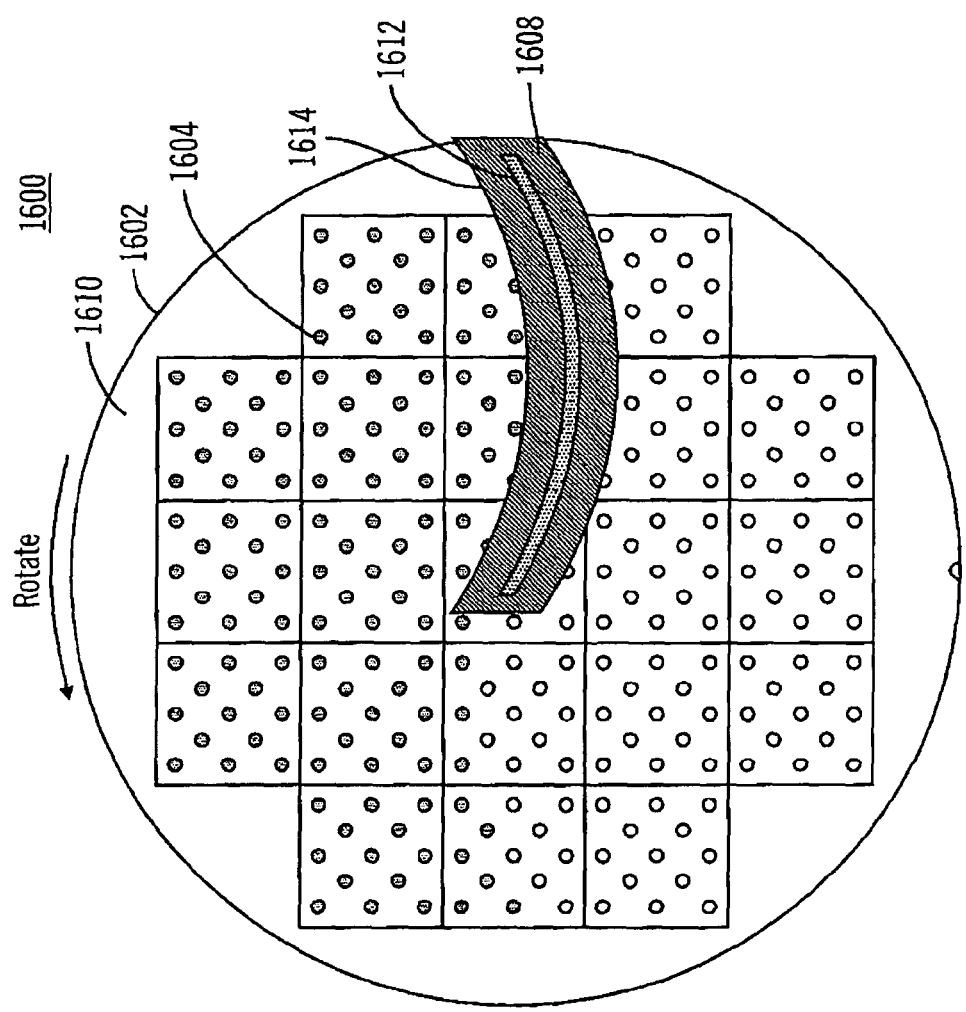
Figure 19:
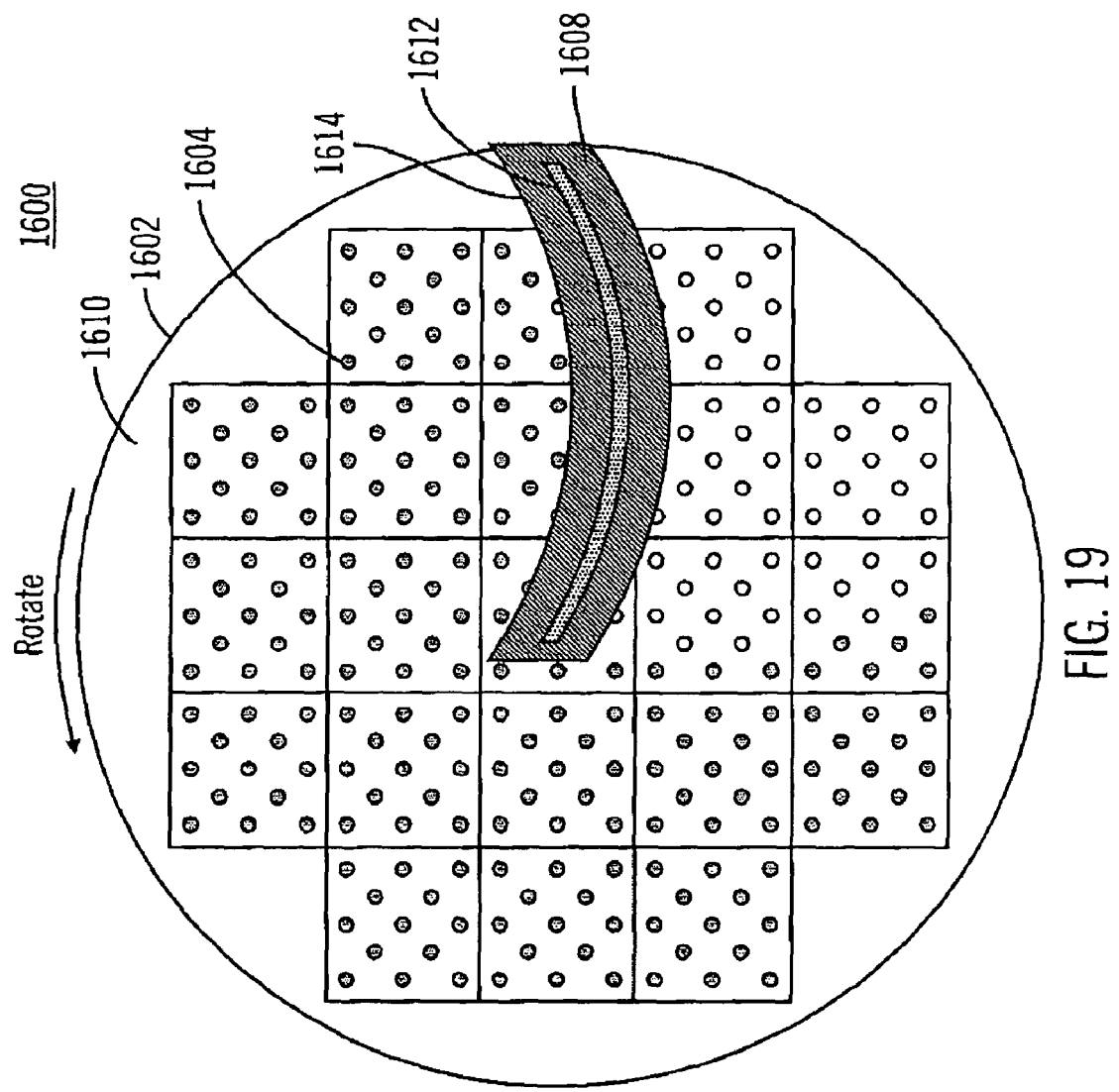
Figure 20:
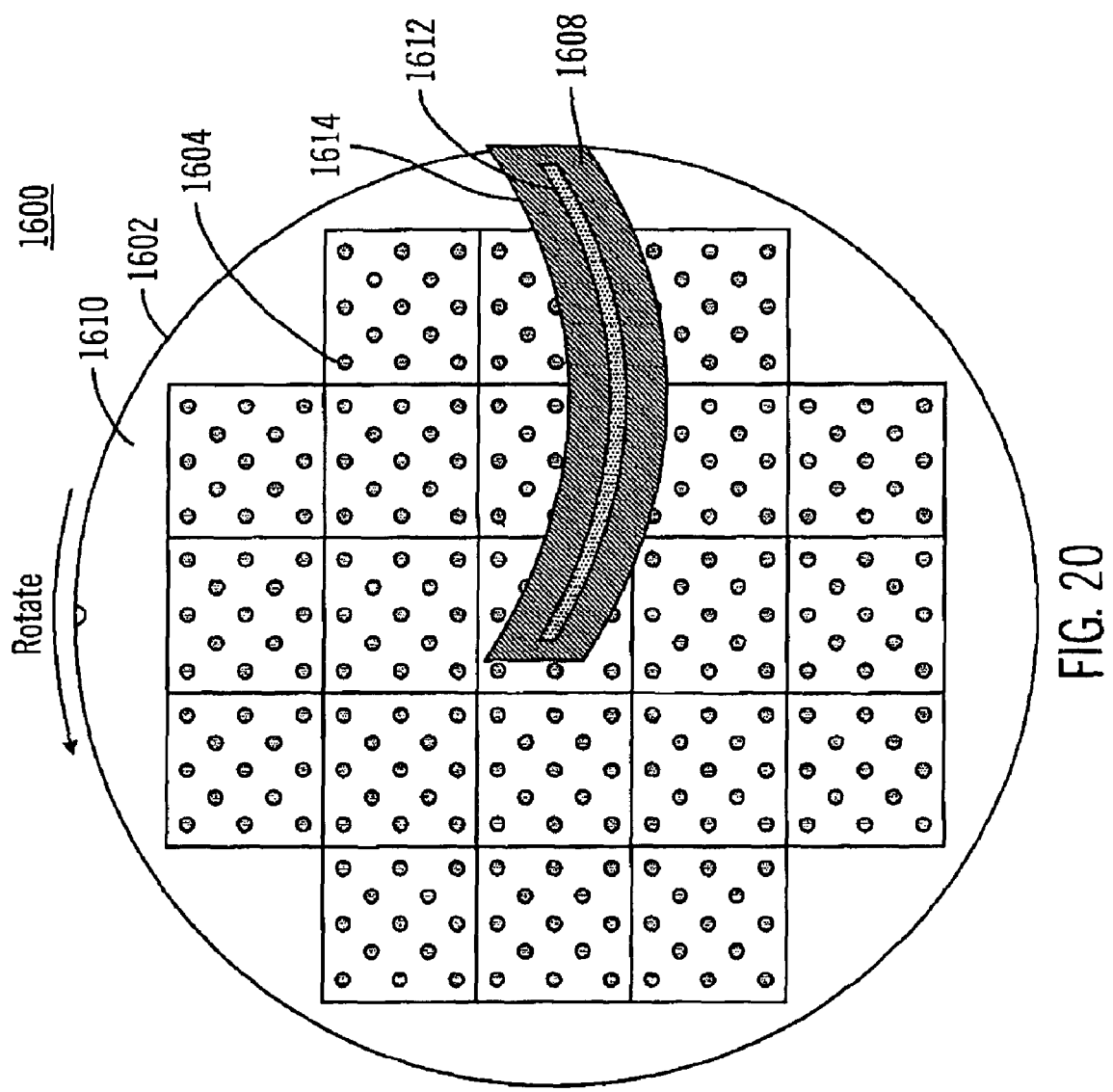

FIGS. 13-15 show another embodiment of the present invention wherein a parking blade 1344 is coupled to the non-rectangular mold 1002 so that the non-rectangular mold 1002 can transition to an adjacent non-rectangular mold (not shown) without spillage of the solder. The parking blade 1344 has a width greater than the fill head 1008. As the non-rectangular mold 1002 is shuttled so that narrower portions of the non-rectangular mold 1002 pass under the filler head 1008, the fill head 1008 extends beyond the edges of the non-rectangular mold 1002. Without the parking blade 1344, solder will spill out of the fill head 1008 causing waster and/or the filled cavities 104 to be compromised. The parking blade 1344 allows for a smooth transition of the fill head 1008 to the next non-rectangular mold 1002 by keeping substantial contact with the fill head 1008.

Exemplary IMS System Utilizing a Fill Head of a Third Type

FIGS. 16-20 show an IMS system 1600 implementing a substantially curved fill head 1608, according to an embodiment of the present invention. FIGS. 16-20 show a progressive sequence in 90 degree increments of the non-rectangular mold 102 being filled with molten solder while rotating 360 degrees. The substantially curved fill head 1608, in one embodiment, is substantially curved relative to the curvature of the perimeter 1630 of the non-rectangular mold 1602. The substantially curved fill head 1608 is aligned along a radius of the non-rectangular mold 1602. As the non-rectangular mold 1602 is rotated up to 360 degrees, the cavities 1604 pass under the delivery slot 1612. Back pressure is applied to the reservoir (not shown) causing molten solder to flow out of the fill head 1612 and onto the top surface 1610 of the non-rectangular mold 1602. The optional fill blade (not shown) forces the molten solder into the cavities 1604. As the cavities 1604 with molten solder pass under the trailing edge 1614 of the substantially curved fill head 1608, the molten solder is solidified.

Figure 21:
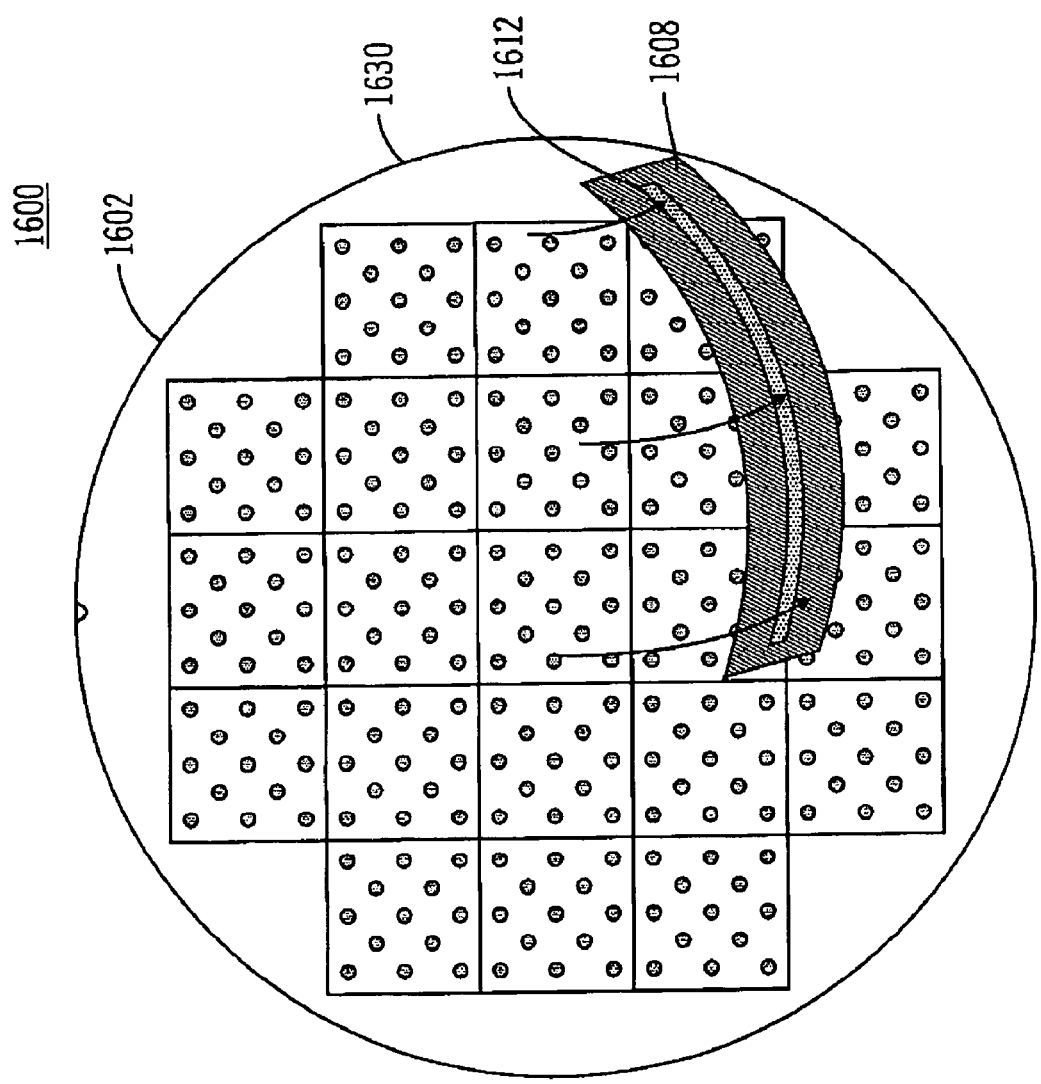
FIGS. 21-22 are top views of an IMS system illustrating a progressive sequence of transitioning the fill head of the third type from a non-rectangular mold after filling cavities in the mold with a conductive bonding material, according to an embodiment of the present invention.
Figure 22:
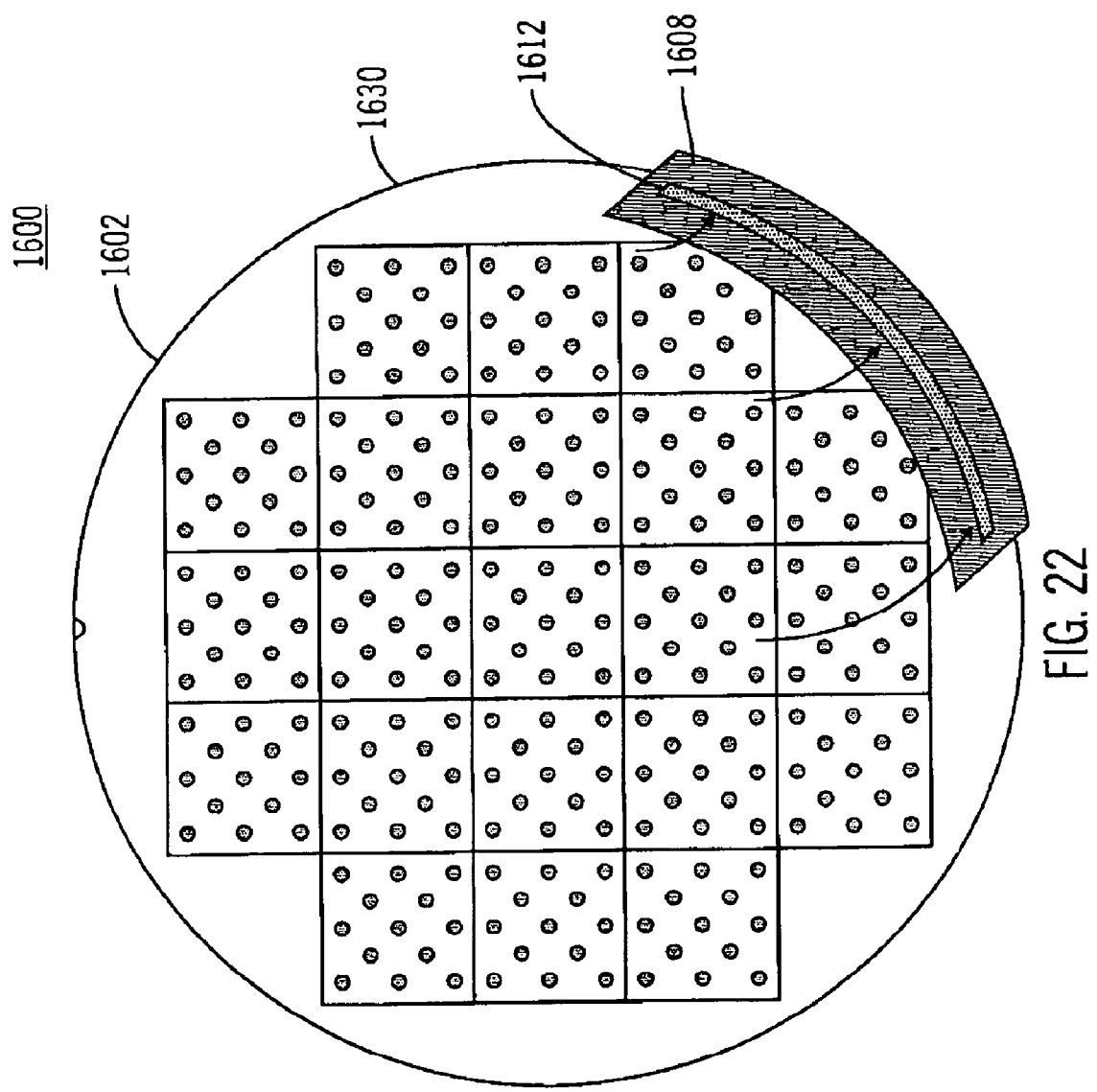

After the cavities 1604 have been filled, the substantially curved fill head 1608 is transitioned to the next non-rectangular mold 1602 by pivoting the substantially curved fill head 1608. For example, FIGS. 21-22 show the substantially curved fill head 1608 being pivoted so that the substantially curved fill head 1608 passes over the outer perimeters 1630 of the non-rectangular mold 102. The delivery slot 1612 is aligned with the outer perimeter 1630, as shown in FIGS. 21-22. The substantially curved fill head 1608 is able to maintain substantial contact with the non-rectangular mold 1602 throughout the transition to an adjacent mold (not shown) without the use of a parking blade. In this embodiment, the non-rectangular molds 1602 are situated with respect to one another so that a minimal gap is produced between the molds 1602. In another embodiment, the substantially curved fill head 1608 remains stationary as the next non-rectangular mold (not shown) is transitioned under the substantially curved fill head 1608.

Prior Art Fill Head with an Electric Resistive Heating Element

Figure 23:
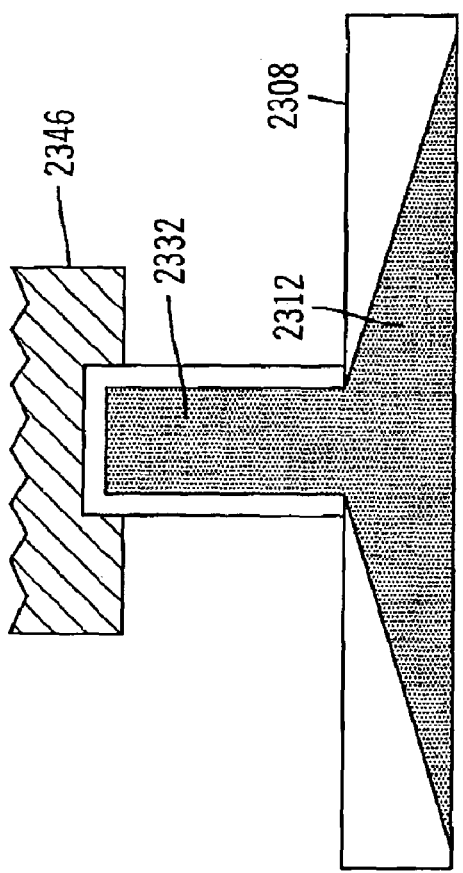
FIG. 23 is a cross sectional view of a prior art IMS fill head.
Figure 24:
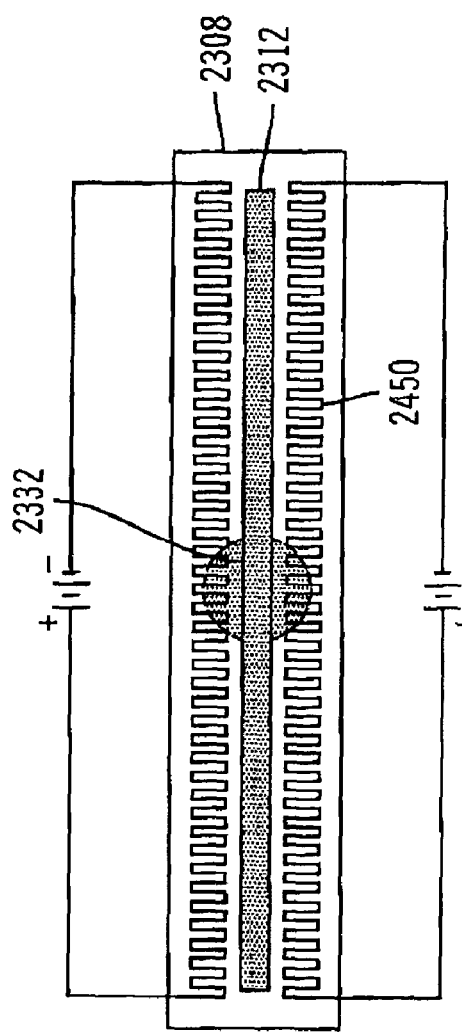
FIG. 24 is a cross-sectional view of a prior art IMS fill head.

FIGS. 23 and 24 show a prior art fill head 2308. The prior art fill head 2308 includes a reservoir 2346 for retaining solder. A solder channel 2332 is coupled to the reservoir 2346 for guiding the solder to a delivery slot 2312. The prior art fill head 2308 also includes an electric resistive heating element 2450. The electric resistive heating element 2450 is built into the surface of the prior art fill head 2308 where the prior art fill head 2308 contacts the mold being filled. The electric resistive heating element 2450 causes mold and the solder to be heated allowing the solder to flow into cavities on the mold.

One problem with the prior art fill head 2308 is the use of an electric resistive heating element 2450, which is used to heat the mold and solder. The performance of the electronic resistive heating element 2450 is limited by a time delay for the heat to be generated in the line and then the conduction of the prior art fill head 2308. Additionally, the prior art fill head 2308 does not provide a means for the solder to be cooled within the cavities of the mold. A time delay in the filling process is also experienced while waiting for the solder to cool within the cavities.

Exemplary Fill Head

Figure 25:
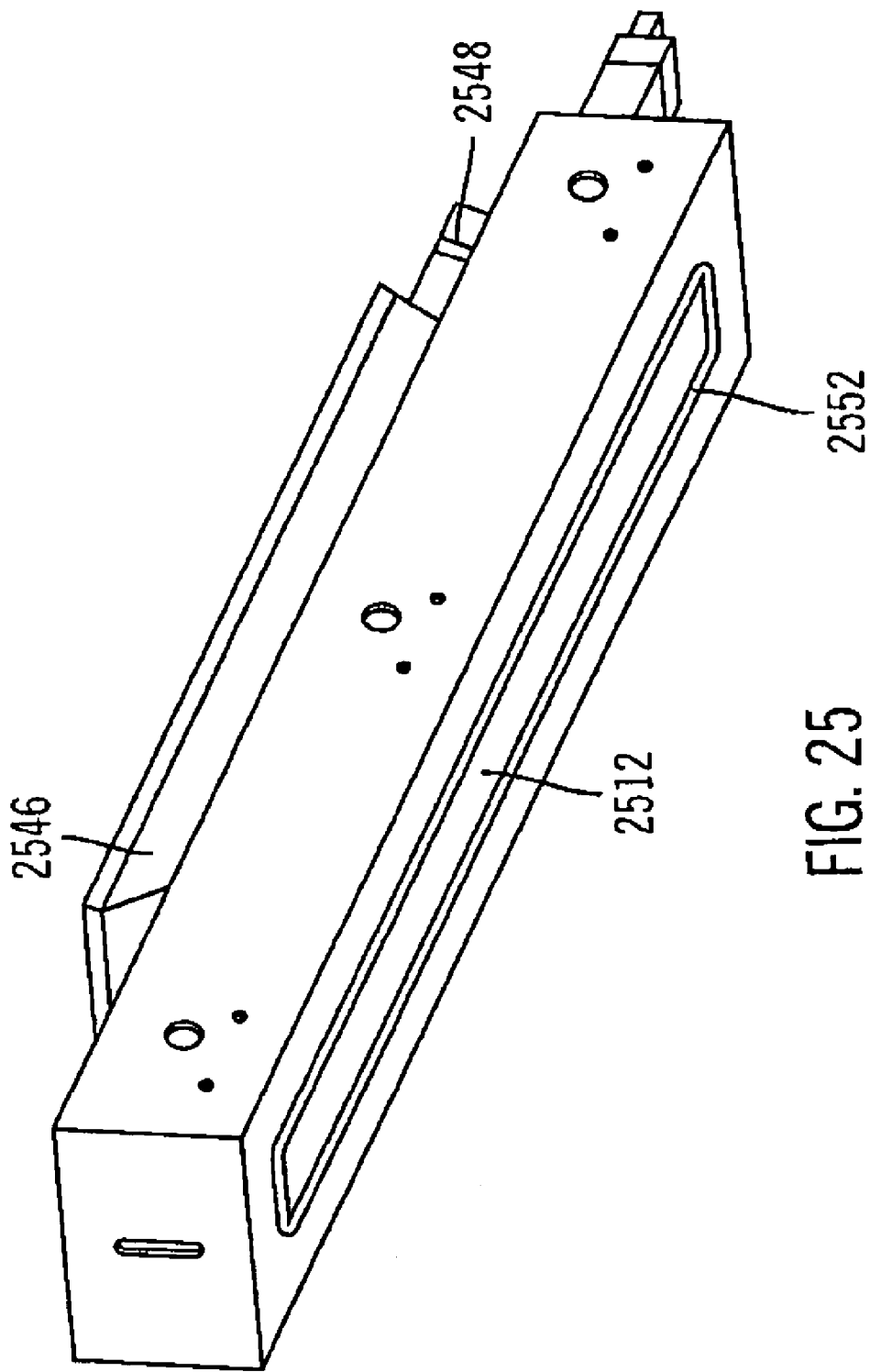
FIG. 25 is an angular view of an exemplary IMS fill head, according to an embodiment of the present invention.

FIG. 25 shows an angular view of an exemplary fill head 2508 and FIGS. 26 and 27 show a cross sectional view and a bottom planar view, respectively, of the fill head 2508 according to an embodiment of the present invention. The fill head 2508 has a conductive bonding material reservoir 2546 for retaining conductive bonding material to be deposited into cavities of a mold. A back pressure is applied by injecting gas through a back pressure port 2548 and into the reservoir 2546. As conductive bonding material such as solder is heated, it flows from the reservoir 2546 through a channel 2632 and into a delivery slot (or slit) 2512. The delivery slot (or slit) 2512 allows the molten solder to flow onto a top surface of a rectangular or non-rectangular mold.

In one embodiment, the fill head 2508 also includes an optional fill blade 2552. In another embodiment, the fill head 2508 does not include an optional fill blade. The optional fill blade 2552 guides the molten solder into the cavities of the rectangular or non-rectangular mold and prevents leakage of the molten solder, leaving a surface clean of solder residue. If the mold is non-rectangular, the fill head 2508 is either slightly longer than a radius of the mold, slightly longer than a diameter of the mold, or is substantially curved to match a curvature of the mold, as described above. Also, in one embodiment, the fill head 2508 is configured so that it can provide conductive bonding material to a rectangular or non-rectangular mold bi-directionally. The solder, in one embodiment, is provided into the cavities contemporaneous with the cavities being in proximity to the fill head 2508.

The fill head 2508 also includes gas channels 2634, 2736 for retaining gas provided by gas ports 2740. Each gas channel is situated along an edge 2620, 2714 of the fill head 2508. The gas(es), in one embodiment, is retained in a gas reservoir(s) (not shown) external to the fill head 2508. Gas lines 2738 coupled to gas ports 2740 transport gas to the gas channels 2634, 2736. In one embodiment, the gas channels 2634, 2736 channel the gases about respective output regions of the fill head 2508. In another embodiment, the at least one of the gas channels 2634, 2736 is situated within the fill head 108 so that solder remains molten as it travels through the delivery slot 2512 and into a cavity 104. Also, one of the gas channels 2634, 2736 is situated within the fill head 108 so that solder solidifies within the cavity 104 as the cavity passes under the fill head 108.

As described above, the fill head 2508 can provide conductive bonding material to cavities either in one direction or bi-directionally. Depending on the filling direction, one of the gas channels 2634, 2736 retains a gas having a high heat capacity and thermal conductivity such as helium. This gas is held at a constant temperature above the melting point of the material in the material reservoir 2546. The edge 2620, 2714 of the fill head 2508 that is situated in close proximity to the gas channel 2634, 2736 with the hot gas, in one embodiment, is grooved for maximum heat transfer. The hot gas is injected from the external gas reservoir (not shown) into a leading edge, which is the edge the cavities first pass under before they are filled with conductive bonding material. Either of the edges 2620, 2714 described above can be the leading edge or the trailing edge depending on the filling direction.

The hot gas heats at least the leading edge 2620 causing the conductive bonding material to remain molten/liquefied as it passed through the delivery slot (or slit) 2512. The other gas channel 2634, 2736 retains a gas having a temperature below the melting point of the material. A second external gas reservoir (not shown) retains this cool gas, which is injected in the other gas channel 2634, 2736 via the gas lines 2738 and gas ports 2740. The trailing edge 2614 including the gas channel 2634, 2736 with the cool gas is cooled below the melting point of the conductive bonding material. This allows the molten material in the cavities to solidify as the cavities pass under the trailing edge 2714 of the fill head 108. In another embodiment, the cool gas contacts the conductive bonding material in the cavities 104 thereby solidifying the material.

Channeling a hot gas and a cool throughout the fill head 108 (at least in specific regions of the fill head 108) allows for more control over the temperature of the fill head 108 and the solder. For example, the heat/cool load from the mold 102 can change the temperature of the solder. Without the channeling of gases, the reservoir needs to be heated at a much higher temperature so that the solder does not solidify prematurely. In another embodiment, thermocouple probes (not shown) are situated in at least one of the leading edge 2620 and trailing edge 2714 to provide accurate temperature monitoring and feedback.

Another Exemplary Fill Head

Figure 28:
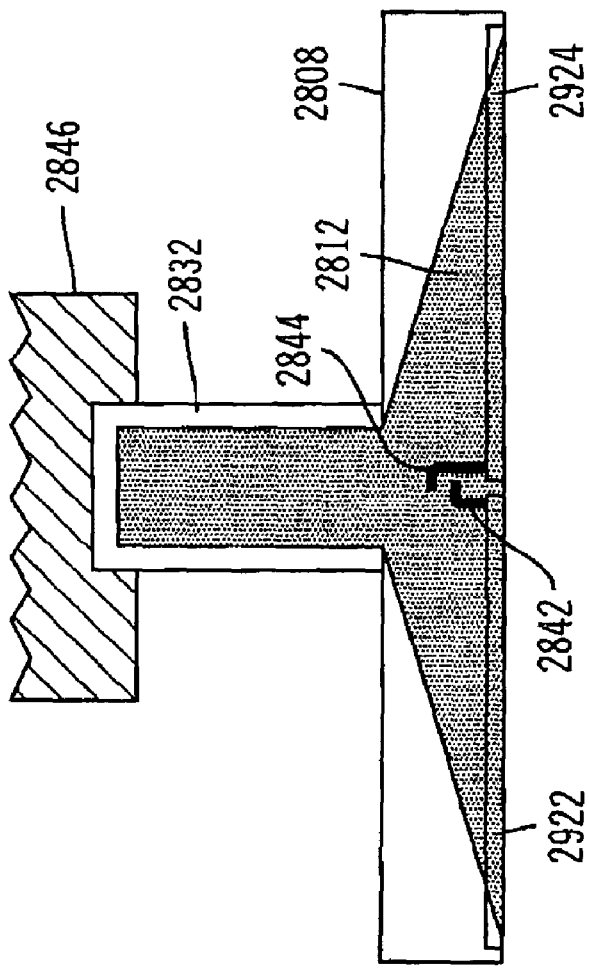
FIG. 28 is a cross-sectional view of another IMS fill head, according to an embodiment of the present invention.
Figure 29:
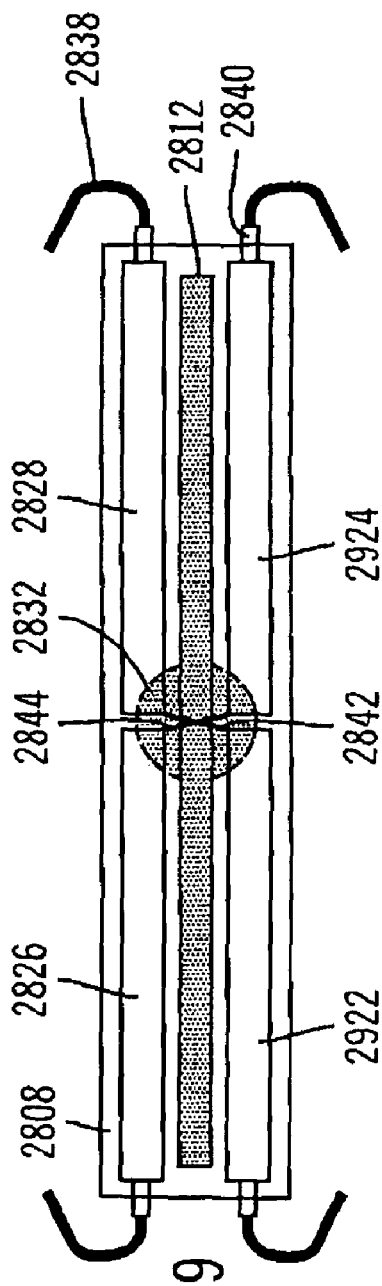
FIG. 29 is a planar cross-sectional view of the IMS fill head of FIG. 25, according to an embodiment of the present invention.

FIGS. 28-29 show a fill head 2808 according to another embodiment of the present invention. The fill head 2808 of FIGS. 28 and 29 includes a reservoir 2846, a back pressure port (not shown) similar to the back pressure port 2548 of FIG. 25, and a delivery slot 2812 similar to the fill head 2508 of FIGS. 26 and 27. However, at least two gas channels 2922, 2924, 2826, 2828 are included at each edge 2820, 2914 of the fill head 2808. For example, a first edge 2914 of the fill head 2808 includes a first gas channel 2922 and a second gas channel 2924 similar to the fill head 1008 as described with respect to FIG. 11. A second edge 2820 of the fill head 2808 includes a third gas channel 2826 and a fourth gas channel 2828 similar to the fill head 1008 as described with respect to FIG. 11. The first gas channel 2922 of the first edge 2914 of the fill head 2808 is coupled to the fourth gas channel 2828 of the second edge 2820 of the fill head 2808 via a first coupling channel 2842. Similarly, the second gas channel 2924 of the first edge 2914 of the fill head 2808 is coupled to the third gas channel 2826 of the second edge 2820 of the fill head 2808 via a second coupling channel 2844. For simplicity, FIG. 28 shows only a portion of the coupling channels 2842, 2844. However, the coupling channels 2842, 2844, in one embodiment, cross over/under each other to connect the first gas channel 2922 to the third gas channel 2828 and the second gas channel 2924 to the fourth gas channel 2826, respectively, as shown in FIG. 29.

The coupling channels 2842, 2844 allow for different gases to be placed in different areas of the fill head 2808 and for the gas locations to be inversed depending on the fill direction of the fill head 2808. The gases are supplied to the gas channels 2822, 2824, 2826, 2828 via the gas lines 2938 and the gas ports 2940, as described with respect to FIGS. 26 and 27. In one embodiment, the gas channels 2922, 2924, 2826, 2828 channel the gases about respective regions of the fill head 2808 that are in close proximity to the conductive bonding material and/or a bottom surface of the fill head 108 that contacts the mold 102.

For example, as described with respect to the fill head 1008 of FIG. 11, when a fill head 1008 is used that runs the diameter of a non-rectangular mold 1002; solder is deposited in two different directions. Having the gas channels configured as in FIGS. 28 and 29 allows for solder to remain molten as one gas is channeled in close proximity of the solder in the fill head 103 and solidified by channeling a gas in close proximity to a surface of the fill head 108 that contacts the mold 102. Coupling the gas channels via the coupling channels 2842, 2844 also allows for the cooling and heating gases to be placed in different channels according to the rotation of the mold 1002 and/or the fill head 1008. Alternatively, when the mold is rectangular, having gas channels configured as shown in FIGS. 28 and 29 allows for solder to be heated and cooled irrespective of the linear fill direction.

The fill heads 2508 and 2808 as described in FIGS. 25-29 are not only advantageous for use with non-rectangular molds but are also advantageous for use with rectangular molds. Current fill heads have resistive heaters within the head. The heater is built into the surface of the fill head where the head contacts the mold being filled. A time delay is experienced because of the time it takes for the heat to be generated in the line and then the conduction of the head. Furthermore, these fill heads do not have any means for cooling the solder within the cavities. The fill heads of the present invention do not experience the time delays as described above. Furthermore, the fill heads of the present invention provide a means to cool the molten solder as the cavities pass under the fill head.

Exemplary Process of Filling a Mold With Solder Using an Exemplary Fill Head

Figure 30:
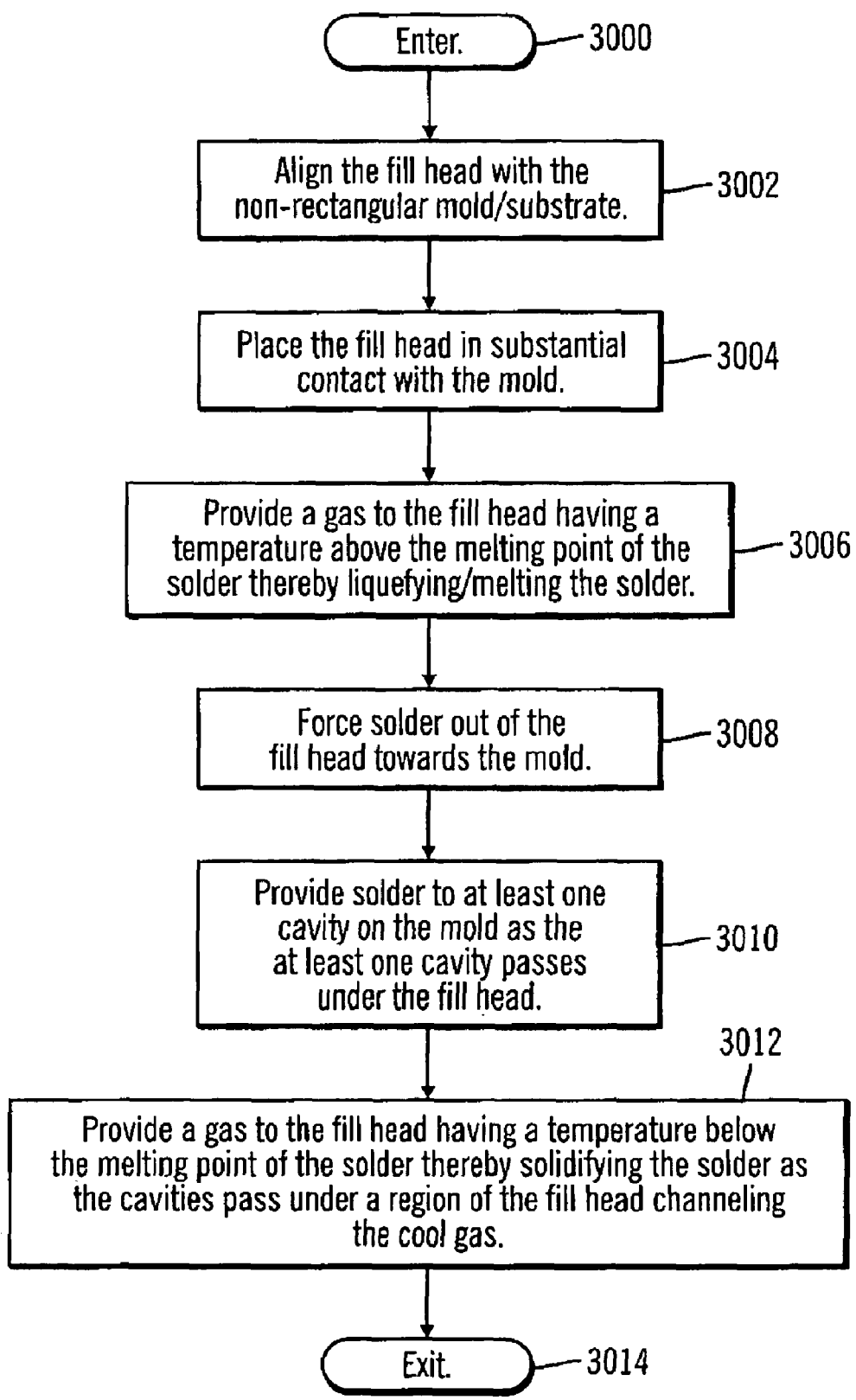
FIG. 30 is an operational flow diagram illustrating an exemplary process of filling molds using rotation of an exemplary fill head including at least one gas channel, according to an embodiment of the present invention.

FIG. 30 is an operational flow diagram showing the exemplary process of filling cavities in a mold using the fill head 2508 including gas channels 2634, 2736. Although the following discussion is with respect to the fill head 2508 of FIG. 25, it is also applicable to the fill head 2808 of FIG. 28. The operational flow diagram of FIG. 30 begins at step 3000 and flows directly to step 3002. The fill head, at step 3002, is aligned with a mold. For example, the fill head 108 is aligned along a radius or a diameter of a non-rectangular mold depending on the type of fill head used or is aligned across the width of a rectangular mold. The fill head 2508, at step 3004, is placed in substantial contact with the mold. A gas, at step 3006, having a temperature above the melting point of the solder is provided to the fill head 5608. This allows the solder to remain liquefied or molten as the gas is channeled in close proximity of the gas. For example, a gas such as helium kept at a constant temperature above the melting point of the solder is transferred from an external reservoir (not shown) to a gas channel 2634 within the fill head 2508. Solder, at step 3008, is forced out of the fill head 2508 towards the mold. For example, a back pressure is applied to a reservoir 2546 forcing the solder to flow through a channel 2632 and out of the fill head 2508.

Solder, at step 3010, is provided to at least one cavity on the mold as the at least one cavity passes under the fill head 2508. An optional fill blade (not shown) exhibits a squeegee effect and guides the molten solder down into the cavity. A gas, at step 3012, having a temperature below the melting point is provided to the fill head 2508. For example, a cool gas is transferred from an external reservoir (not shown) to another gas channel within the fill head 2508. This causes solder in the at least one cavity to solidify as the cavity pass under the area of the fill head 2508 where the cool gas is being channeled. The control flow then exits at step 3014.

Non-Limiting Examples

The foregoing embodiments of the present invention are advantageous because they provide a fill head that includes at least one gas channel. The gas channel allows for a gas having a temperature above the melting point of the conductive bonding material to be retained within the fill head. The hot gas allows for the conductive bonding material to remain liquid, liquefy, or become molten as it is provided to cavities of a mold. Another gas channel within the fill head allows for gas with a temperature below the melting point of the conductive bonding material to be retained within the fill head. This causes the conductive bonding material to solidify as it comes into contact with the gas.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A system for injection molding solder into a plurality of cavities in a surface of a circular mold, the system comprising:
   a circular mold having a surface including a plurality of cavities;
   a solder placement device for providing solder into the plurality of cavities in the surface of the circular mold, the solder placement device comprising:
      a fill head comprising a first gas channel, a second gas channel, a third gas channel, and a fourth gas channel; and
      a solder reservoir mechanically coupled to the fill head for providing solder to the fill head from the solder reservoir, and wherein the solder placement device being adapted to:
         align the fill head with the surface of the circular mold, wherein the fill head is slightly longer than a diameter of the surface of the circular mold, and further wherein the fill head comprises a substantially curved configuration substantially matching a curvature of a perimeter of the surface of the circular mold, the fill head being aligned relative to a radius of the surface of the circular mold;
         place the fill head in substantial contact with the surface;
         channel a first gas through the first gas channel and about a first region of the fill head, the first gas having a temperature above a melting point of solder residing in the reservoir mechanically coupled to the fill head thereby maintaining the solder in a molten state as the solder and the first gas are in close proximity to one another;
         force the solder out of the fill head toward the surface;
         provide the solder into at least one cavity of the plurality of cavities contemporaneous with the at least one cavity being in proximity to the fill head;
         channel a second gas through the second gas channel and about a second region of the fill head, the second gas having a temperature below the melting point of the solder thereby substantially solidifying the solder within the at least one cavity as the at least one cavity passes under the second region of the fill head with the second gas;
         channel the first gas to the third gas channel, wherein the third gas channel is mechanically coupled to the first gas channel and is situated about a third region of the fill head that is different than the first region of the fill head; and
         channel the second gas to the fourth gas channel, wherein the fourth gas channel is mechanically coupled to the second gas channel and is situated about a fourth region of the fill head that is different than the second region of the fill head.

* * * * *